(12) United States Patent
Kohler et al.

(10) Patent No.: US 6,348,237 B2
(45) Date of Patent: Feb. 19, 2002

(54) JET PLASMA PROCESS FOR DEPOSITION OF COATINGS

(75) Inventors: Gunter A. Kohler, Grant Township, MN (US); William H. Esswein, Hudson, WI (US); Seth M. Kirk, Minneapolis, MN (US); Brian J. Gates, Eagan, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/759,803

(22) Filed: Jan. 12, 2001

Related U.S. Application Data

(62) Division of application No. 08/920,419, filed on Aug. 29, 1997, now Pat. No. 6,203,898.

(51) Int. Cl.[7] .................................................. C08J 7/18
(52) U.S. Cl. ............. 427/489; 427/249.15; 427/255.23; 427/256.6; 427/294; 427/407.1; 427/570; 427/574; 427/578
(58) Field of Search .............................. 427/489, 488, 427/249.15, 255.23, 256.6, 294, 407.1, 570, 574, 578

(56) References Cited

U.S. PATENT DOCUMENTS

| | | | |
|---|---|---|---|
| 3,503,859 A | 3/1970 | Goncarovs et al. | 204/165 |
| 3,569,661 A | 3/1971 | Ehrling, Jr. | 219/121 |
| 3,585,434 A | 6/1971 | Kato et al. | 313/161 |

(List continued on next page.)

FOREIGN PATENT DOCUMENTS

| | | |
|---|---|---|
| DE | 42 39 511 A | 5/1994 |
| EP | 299 754 A2 | 1/1989 |
| EP | 523 609 A2 | 1/1993 |
| EP | 569 771 A1 | 11/1993 |
| EP | 607 987 A2 | 7/1994 |
| GB | 2 122 224 A | 1/1984 |
| GB | 2 225 344 A | 5/1990 |
| JP | 57 011448 A | 5/1982 |
| JP | 58-162194 | 9/1983 |
| JP | 62-47483 | 3/1987 |
| JP | 2-213481 | 8/1990 |
| SU | 924 063 | 4/1982 |
| WO | WO 95 18249 A | 7/1995 |

OTHER PUBLICATIONS

L.Y. Alimova et al., "Effects of Thin Carbon Films on the Selective Gas Permeability of a Polymer Membrane," *J. Eng. Phy.*, (Jan., 1985), pp. 78–81.

R.L. Berger et al., "A Stopped–Flow Mixer Device for a Batch Microcalorimeter Application to NAD–NADase Reaction," *J. Biochem. Biophy. Methods*, 18, (1989), pp. 113–124.

B. Singh et al., "Hollow cathode Plasma Assisted Chemical Vapor Deposition of Diamond," *Appl. Phys. Lett.*, 52, (May, 1988), pp. 1658–1660.

(List continued on next page.)

*Primary Examiner*—Bernard Pianalto
(74) *Attorney, Agent, or Firm*—Melanie Gover

(57) ABSTRACT

The present invention provides a method for the formation of an organic coating on a substrate. The method includes: providing a substrate in a vacuum; providing at least one vaporized organic material comprising at least one component from at least one source, wherein the vaporized organic material is capable of condensing in a vacuum of less than about 130 Pa; providing a plasma from at least one source other than the source of the vaporized organic material; directing the vaporized organic material and the plasma toward the substrate; and causing the vaporized organic material to condense and polymerize on the substrate in the presence of the plasma to form an organic coating.

23 Claims, 5 Drawing Sheets

U.S. PATENT DOCUMENTS

| | | | |
|---|---|---|---|
| 3,641,973 A | 2/1972 | Shrader | 118/49 |
| 3,652,325 A | 3/1972 | Hunt | 117/107 |
| 3,754,117 A | 8/1973 | Walter | 219/383 |
| 3,783,227 A | 1/1974 | Aitken | 219/121 P |
| 3,883,679 A | 5/1975 | Shrader et al. | 13/31 |
| 4,006,268 A | 2/1977 | Kennedy et al. | 427/42 |
| 4,013,532 A | 3/1977 | Cormia et al. | 204/192 C |
| 4,046,659 A | 9/1977 | Cormia et al. | 204/192 C |
| 4,065,097 A | 12/1977 | Timin | 251/228 |
| 4,076,866 A | 2/1978 | Platakis et al. | 427/250 |
| 4,166,018 A | 8/1979 | Chapin | 204/192 |
| 4,290,384 A | 9/1981 | Ausschnitt et al. | 118/722 |
| 4,382,100 A | 5/1983 | Holland | 427/38 |
| 4,407,712 A | 10/1983 | Henshaw et al. | 204/290 |
| 4,434,188 A | 2/1984 | Kamo et al | 427/39 |
| 4,449,286 A | 5/1984 | Dahlberg | 29/572 |
| 4,457,949 A | 7/1984 | Takasaki et al. | 427/39 |
| 4,486,286 A | 12/1984 | Lewin et al. | 204/192 |
| 4,490,229 A | 12/1984 | Mirtich et al. | 204/192 C |
| 4,490,774 A | 12/1984 | Olson et al. | 361/311 |
| 4,515,931 A | 5/1985 | Olson et al. | 526/323.2 |
| 4,526,833 A | 7/1985 | Burguette et al. | 428/336 |
| 4,533,710 A | 8/1985 | Olson et al. | 526/323.2 |
| 4,543,275 A | 9/1985 | Akashi et al. | 427/250 |
| 4,551,216 A | 11/1985 | Argyo | 204/192 C |
| 4,557,946 A | 12/1985 | Sacher et al. | 427/41 |
| 4,569,738 A | 2/1986 | Kieser et al. | 204/173 |
| 4,603,082 A | 7/1986 | Zelez | 428/336 |
| 4,645,977 A | 2/1987 | Kurokawa et al. | 315/111.21 |
| 4,647,818 A | 3/1987 | Ham | 315/111.21 |
| 4,661,409 A | 4/1987 | Kieser et al. | 428/408 |
| 4,663,183 A | 5/1987 | Ovshinsky et al. | 427/39 |
| 4,666,784 A | 5/1987 | Inukai et al. | 428/425.9 |
| 4,696,719 A | 9/1987 | Bischoff | 202/205 |
| 4,698,256 A | 10/1987 | Giglia et al. | 428/216 |
| 4,702,963 A | 10/1987 | Phillips et al. | 428/426 |
| 4,717,622 A | 1/1988 | Kurokawa et al. | 428/408 |
| 4,725,345 A | 2/1988 | Sakamoto et al. | 204/192.31 |
| 4,755,426 A | 7/1988 | Kokai et al. | 428/336 |
| 4,756,964 A | 7/1988 | Kincaid et al. | 428/408 |
| 4,767,608 A | 8/1988 | Matsumoto et al. | 423/446 |
| 4,770,940 A | 9/1988 | Ovshinsky et al. | 428/408 |
| 4,772,513 A | 9/1988 | Sakamoto et al. | 428/408 |
| 4,780,354 A | 10/1988 | Nakayama et al. | 428/141 |
| 4,794,047 A | 12/1988 | Funamoto | 428/408 |
| 4,804,590 A | 2/1989 | Nakamura et al. | 428/408 |
| 4,814,199 A | 3/1989 | Boccalon et al. | 427/38 |
| 4,820,584 A | 4/1989 | Morita et al. | 428/457 |
| 4,830,873 A | 5/1989 | Benz et al. | 427/35 |
| 4,833,031 A | 5/1989 | Kurokawa et al. | 428/336 |
| 4,847,469 A | 7/1989 | Hofmann et al. | 219/273 |
| 4,861,662 A | 8/1989 | Kobliska et al. | 428/408 |
| 4,888,199 A | 12/1989 | Felts et al. | 427/10 |
| 4,932,331 A | 6/1990 | Kurihara et al. | 106/286.1 |
| 4,933,300 A | 6/1990 | Koinuma et al. | 437/110 |
| 4,935,303 A | 6/1990 | Ikoma et al. | 428/408 |
| 4,954,371 A | 9/1990 | Yializis | 427/44 |
| 4,958,591 A | 9/1990 | Yamazaki | 118/723 |
| 5,002,794 A | 3/1991 | Ratner et al. | 427/41 |
| 5,009,924 A | 4/1991 | Wyman | 427/44 |
| 5,016,565 A | 5/1991 | Saitoh et al. | 118/723 |
| 5,017,403 A | 5/1991 | Pang et al. | 427/39 |
| 5,018,048 A | 5/1991 | Shaw et al. | 361/323 |
| 5,032,461 A | 7/1991 | Shaw et al. | 428/461 |
| 5,052,339 A | 10/1991 | Vakerlis et al. | 118/723 |
| 5,068,124 A | 11/1991 | Batey et al. | 427/39 |
| 5,091,208 A | 2/1992 | Pryor | 427/38 |
| 5,096,738 A | 3/1992 | Wyman | 427/44 |
| 5,097,800 A | 3/1992 | Shaw et al. | 118/730 |
| 5,104,509 A | 4/1992 | Buck et al. | 204/192.38 |
| 5,116,665 A | 5/1992 | Gauthier et al. | 428/216 |
| 5,125,138 A | 6/1992 | Shaw et al. | 29/25.42 |
| 5,182,132 A | 1/1993 | Murai et al. | 427/577 |
| 5,185,179 A | 2/1993 | Yamazaki et al. | 427/601 |
| 5,198,263 A | 3/1993 | Stafford et al. | 427/577 |
| 5,204,145 A | 4/1993 | Gasworth | 427/577 |
| 5,215,822 A | 6/1993 | Wyman et al. | 428/447 |
| 5,230,931 A | 7/1993 | Yamazaki et al. | 427/569 |
| 5,232,791 A | 8/1993 | Kohler et al. | 428/694 |
| 5,238,705 A | 8/1993 | Hayashi et al. | 427/122 |
| 5,260,107 A | 11/1993 | Kawamura et al. | 427/577 |
| 5,270,028 A | 12/1993 | Tanabe et al. | 423/446 |
| 5,286,534 A | 2/1994 | Kohler et al. | 427/577 |
| 5,298,587 A | 3/1994 | Hu et al. | 528/10 |
| 5,314,540 A | 5/1994 | Nakamura et al. | 118/723 DC |
| 5,320,875 A | 6/1994 | Hu et al. | 427/493 |
| 5,457,298 A | 10/1995 | Nelson et al. | 219/121.52 |
| 5,464,667 A | 11/1995 | Kohler et al. | 427/577 |

OTHER PUBLICATIONS

"Glow Discharges" in *Reactions Under Plasma Conditions*, M. Venugopalan, Ed., Wiley–Interscience: New York, (1971), pp. 297–298.

L. Bardos et al., "High Rate Jet Plasma–Assisted Chemical Vapour Deposition," *Thin Solid Films*, 158, (1988), pp. 265–270.

M. Hilden et al., "Sputtered Carbon on Particulate Media," *IEEE Transactions on Magnetics*, 26, (Jan., 1990), pp. 174–177.

N. Koshino et al. in *Diamond&Diamond–Like Material Synthesis*, Extended Abstracts of the 1988 Spring Meeting (Apr. 5–9, 1988) of the Materials Research Society, pp. 95–98.

S. Matsumoto, "Deposition of Diamond from Thermal Plasma," in *Diamond&Diamond–Like Material Synthesis*, Extended Abstracts of the 1988 Spring Meeting (Apr. 5–9, 1988) of the Materials Research Society, pp. 119–123.

JET PLASMA PROCESS FOR DEPOSITION OF COATINGS

This is a divisional of application Ser. No. 08/920,419 filed Aug. 29, 1997 now U.S. Pat. No. 6,203,898.

FIELD OF THE INVENTION

The present invention relates to coatings, particularly organic coatings containing carbon and/or silicon coatings, and to a method and apparatus for the plasma deposition of such coatings.

BACKGROUND OF THE INVENTION

Plasma processes offer the opportunity to make coatings that can be quite hard, chemically inert, corrosion resistant, and impervious to water vapor and oxygen. These are often used as mechanical and chemical protective coatings on a wide variety of substrates. For example, carbon-rich coatings (e.g., diamond-like carbon and jet plasma carbon coatings) have been applied to rigid disks and flexible magnetic media. They have also been applied to acoustic diaphragms, polymeric substrates used in optical and ophthalmic lenses, as well as electrostatic photographic drums. Silicon-containing polymer coatings have been applied to polymeric and metal substrates for abrasion resistance. Also, silicone coatings have been applied to polymeric and non-polymeric substrates to reduce water permeability and to provide mechanical protection.

Carbon-rich coatings, as used herein, contain at least 50 atom percent carbon, and typically about 70–95 atom percent carbon, 0.1–20 atom percent nitrogen, 0.1–15 atom percent oxygen, and 0.1–40 atom percent hydrogen. Such carbon-rich coatings can be classified as "amorphous" carbon coatings, "hydrogenated amorphous" carbon coatings, "graphitic" coatings, "i-carbon" coatings, "diamond-like" coatings, etc., depending on their physical and chemical properties. Although the molecular structures of each of these coating types are not always readily distinguished, they typically contain two types of carbon-carbon bonds, i.e., trigonal graphite bonds ($sp^2$) and tetrahedral diamond bonds ($sp^3$), although this is not meant to be limiting. They can also contain carbon-hydrogen bonds and carbon-oxygen bonds, etc. Depending on the amount of noncarbon atoms and the ratio of $sp^3/sp^2$ bonds, different structural and physical characteristics can be obtained.

Diamond-like carbon-rich coatings have diamond-like properties of extreme hardness, extremely low electrical conductivity, low coefficients of friction, and optical transparency over a wide range of wavelengths. They can be hydrogenated or nonhydrogenated. Diamond-like carbon coatings typically contain noncrystalline material having both trigonal graphite bonds ($sp^2$) and tetrahedral diamond bonds ($sp^3$); although it is believed the $sp^3$ bonding dominates. Generally, diamond-like coatings are harder than graphitic carbon coatings, which are harder than carbon coatings having a large hydrogen content, i.e., coatings containing hydrocarbon molecules or portions thereof.

Silicon-containing coatings are usually polymeric coatings that contain in random composition silicon, carbon, hydrogen, oxygen, and nitrogen ($SiO_wN_xC_yH_z$). These coatings are usually produced by plasma enhanced chemical vapor deposition (PECVD) and are useful as barrier and protective coatings. See, for example, U.S. Pat. No. 5,298,587 (Hu et al.), U.S. Pat. No. 5,320,875 (Hu et al.), U.S. Pat. No. 4,830,873 (Benz et al.), and U.S. Pat. No. 4,557,946 (Sacher et al.).

Silicone coatings are high molecular weight polymerized siloxane coatings containing in their structural unit $R_2SiO$ in which R is usually $CH_3$ but may be H, $C_2H_5$, $C_6H_5$, or more complex substituents. These silicones (often referred to as polyorganosiloxanes) consist of chains of alternating silicon and oxygen atoms (O—Si—O—Si—O) with the free valences of the silicon atoms joined usually to R groups, but also to some extent to oxygen atoms that are joined to (crosslinked) silicon atoms in a second chain, thereby forming an extended network. These coatings are valued for their toughness, their lubricity, controlled gas diffusion, and their ability to lower surface tension desirable for release coatings and water repellent surfaces. For example, U.S. Pat. No. 5,096,738 (Wyman) teaches the formation of barrier coatings via the hydrolysis of trialkoxy methyl silane resulting in highly crosslinked polymer structures.

Methods for preparing coatings by plasma deposition, i.e., plasma-enchanced chemical vapor deposition, are known; however, some of these methods have deficiencies. For example, with certain methods the use of high gas flow, pressure, and power can cause formation of carbon powder, instead of the desirable smooth, hard carbon film. U.S. Pat. No. 5,232,791 (Kohler et al.), U.S. Pat. No. 5,286,534 (Kohler et al.), and U.S. Pat. No. 5,464,667 (Kohler et al.) disclose a process for the plasma deposition of a carbon-rich coating that overcomes some of these deficiencies. These processes use a carbon-rich plasma, which is generated from a gas, such as methane, ethylene, methyliodide, methylcyanide, or tetramethylsilane, in an elongated hollow cathode, for example. The plasma is accelerated toward a substrate exposed to a radio frequency bias voltage. Although this process represents a significant advancement in the art, other plasma deposition processes are needed for deposition of a wide variety of carbon- and/or silicon-containing coatings using lower energy requirements.

Methods of preparing multilayer coatings are described in U.S. Pat. No. 5,116,665 (Gauthier et al.) and U.S. Pat. No. 4,933,300 (Koinuma et al.), and UK Patent Application Publication No. GB 2 225 344 A (Eniricerche SpA). These methods are based on glow discharge processes, which utilize one reactor and successive changes in process parameters for the construction of multilayer coatings. These methods, however, have practical and technical limitations. A batch type process is required if gradual and/or abrupt changes of layer properties are desired. Those changes are obtained by deposition on stationary substrates and successive changes in process conditions. Continuous deposition can be obtained in a reactor that accommodates a roll-to-roll web transport system. Multipass operation is required to construct multilayer coatings. Under those circumstances a gradual change of layer properties and/or the formation of interfacial layers are difficult to obtain.

Thus, plasma deposition processes are needed for deposition of a wide variety of carbon- and/or silicon-containing coatings using relatively low energy requirements. Also, plasma deposition processes are needed that can accommodate a gradual change of layer properties and/or the formation of interfacial layers.

SUMMARY OF THE INVENTION

The present invention provides a method for the formation of an organic coating on a substrate comprising: providing a substrate in a vacuum; providing at least one vaporized organic material comprising at least one component from at least one source, wherein the vaporized organic material is capable of condensing in a vacuum of less than about 130 Pa; providing a plasma from at least one source other than the source of the vaporized organic material; directing the vaporized organic material and the plasma toward the substrate; and causing the vaporized organic material to condense and polymerize on the substrate in the presence of the plasma to form an organic coating.

The step of providing a plasma preferably includes generating a plasma in a vacuum chamber by: injecting a plasma gas into a hollow cathode system; providing a sufficient voltage to create and maintain a plasma within the hollow cathode system; and maintaining a vacuum in the vacuum chamber sufficient for maintaining the plasma. In a preferred embodiment, the hollow cathode system includes: a cylinder having an outlet end; a magnet surrounding the outlet end of the cylinder; and a tube having a leading edge, wherein the tube is positioned inside the cylinder and recessed such that the leading edge of the tube is in the plane of the center line of the magnet.

Also provided is an organic coating on a substrate preparable by: providing a substrate in a vacuum; providing at least one vaporized organic material comprising at least one component from at least one source, wherein the vaporized organic material is capable of condensing in a vacuum of less than about 130 Pa; providing a plasma from a source other than the at least one source of the vaporized organic material; directing the vaporized organic material and the plasma toward the substrate; causing the plasma to interact with the vaporized organic material and form a reactive organic species; and contacting the substrate with the reactive organic species to form an organic coating. The coating can include one layer of a single organic material or multiple organic materials. Alternatively, it can include multiple layers of different organic materials.

The present invention also provides a non-diamond-like organic coating on a substrate comprising an organic material comprising at least one major component, wherein the coating has a density that is at least about 50% greater than the density of the major component of the organic material prior to coating. For one component layer, the non-diamond-like organic coating preferably has substantially the same composition and structure as that of the starting material.

The present invention also provides a jet plasma apparatus for forming a coating on a substrate comprising: a cathode system for generating a plasma; an anode system positioned relative to the cathode system such that the plasma is directed from the cathode system past the anode system and toward the substrate to be coated; and an oil delivery system for providing vaporized organic material positioned relative to the cathode system such that the vaporized organic material and the plasma interact prior to, or upon contact with, the substrate.

The present invention further provides a hollow cathode system comprising: a cylinder having an outlet end; a magnet surrounding the outlet end of the cylinder; a tube having a leading edge, wherein the ceramic tube is positioned inside the cylinder and recessed such that the leading edge of the ceramic tube is in the plane of the center line of the magnet.

DETAILED DESCRIPTION OF THE INVENTION

Figure 1:
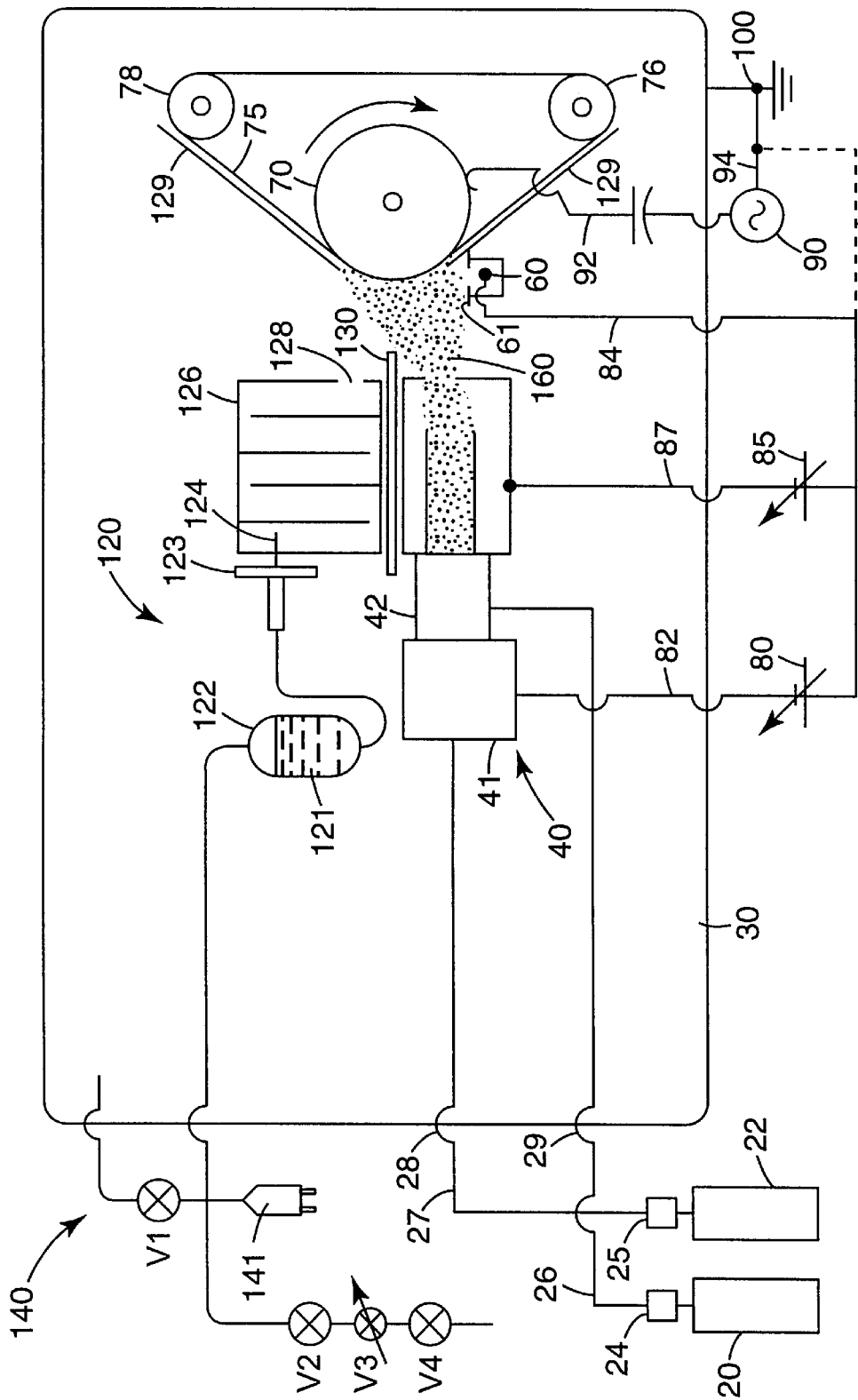
FIG. 1 is a schematic diagram of a jet plasma vapor deposition apparatus of the present invention.

The present invention provides methods and systems for forming organic coatings, particularly carbon-containing coatings (e.g., carbon-rich coatings as defined above), silicon-containing coatings (e.g., silicone coatings as defined above), or combinations thereof, and the coatings themselves. The methods of forming the coatings occur by means of plasma interaction with a vaporized organic material, which is normally a liquid at ambient temperature and pressure. The systems of the present invention can be used to deposit low cost coatings, which can have a wide range of specific densities. These coatings can be uniform multi-component coatings (e.g., one layer coatings produced from multiple starting materials), uniform one-component coatings, and/or multilayer coatings (e.g., alternating layers of carbon-rich material and silicone materials).

Generally, the coating processes use a plasma (i.e., expanded gaseous reactive ionized atoms or molecules and neutral molecular fragments) and at least one vaporized organic material containing at least one component, wherein the vaporized organic material is capable of condensing in a vacuum of less than about 1 Torr (130 Pa). These vapors are directed toward a substrate in a vacuum (either in outer space or in a conventional vacuum chamber). This substrate is in close proximity to a radio frequency bias electrode and is preferably negatively charged as a result of being exposed to a radio frequency bias voltage. Significantly, these coatings are prepared without the need for solvents.

For example, using a carbon-rich plasma in one stream from a first source and a vaporized high molecular weight organic liquid such as dimethylsiloxane oil in another stream from a second source, a one-pass deposition procedure results in a multilayer construction of the coating (i.e., a layer of a carbon-rich material, a layer of dimethylsiloxane that is at least partially polymerized, and an intermediate or interfacial layer of a carbon/dimethylsiloxane composite). Variations in system arrangements result in the controlled formation of uniform multi-component coatings or layered coatings with gradual or abrupt changes in properties and composition as desired. Uniform coatings of one material can also be formed from a carrier gas plasma, such as argon, and a vaporized high molecular weight organic liquid, such as dimethylsiloxane oil.

The coatings formed using the jet plasma process described herein can have a wide variety of properties. They can be tough, scratch resistant, chemically resistant, and suitable for use as protective coatings. They can be impermeable to liquids and gases, and suitable for use as barrier coatings. They can have a controlled void/pore structure selective for molecular diffusion, and suitable for use as separation membranes. They can be transparent and antireflective, and suitable for use as an optical coating. They can have tailored surface energies and variable conductivity and resistivity. Hence, the coatings can have a wide variety of uses.

Preferred carbon-rich coatings and preferred silicone coatings are impervious to water vapor and oxygen, and are generally resistant to mechanical and chemical degradation. They are also sufficiently elastic such that they can be used on typical flexible substrates used in, for example, magnetic media and packaging films.

Such preferred coatings are highly polymerized and/or crosslinked materials, i.e., materials having a crosslink density generally greater than that obtained if conventional methods of deposition, such as conventional PECVD methods, are used. Specifically, for example, the present invention provides a substrate on which is coated a silicone coating, preferably a polymerized diorganosiloxane, having a high concentration of crosslinked siloxane groups (i.e., high Si—O—Si crosslinkage) and a reduced concentration of organic groups (e.g., methyl groups) relative to the starting material.

Preferably, the coatings of the present invention are non-diamond-like coatings yet generally very dense. The density of a coating is preferably at least about 10% (and more preferably, at least about 50%) greater than the major component of the organic material prior to vaporization (preferably, greater than any of the starting materials). Typically, the organic starting materials are in the form of oils, and the resultant coating can have a density that is preferably at least about 10% (and more preferably, at least about 50%) greater than that of the oil used in the greatest amount. With methods of deposition that do not expose the substrate to a radio frequency bias voltage, there is only a minor increase (e.g., less than about 10%) in the density of the coatings relative to the starting materials. Herein, density is measured by the floating method as described below. Preferred silicone coatings of the present invention have a density of at least about 1.0.

Typically, as the radio frequency bias to which the substrate is exposed in the method described herein increases, the density and hardness of the coatings increase. As the density and hardness increase, the barrier properties for water vapor and/or oxygen (and other gases) increase. It is even possible to get several orders of magnitude increase in barrier properties and hardness using the methods of the present invention.

The present invention also provides a substrate on which is coated polymerized mineral oil (i.e., an aliphatic hydrocarbon), such as Nujol. This provides a decrease in water vapor transmission, which is believed to be associated with an increase in density. Thus, one organic material that can be used as a starting material in the methods of the present invention is mineral oil. Other such organic materials include other aromatic and aliphatic hydrocarbons as well as silicon- and oxygen-containing hydrocarbons such as silicone oil and perfluoropolyethers, which can be used alone or in combination. Suitable organic materials are those that have strong bonds in the backbone that do not break down easily in a vacuum. They can be aromatic, aliphatic, or combinations thereof (e.g., compounds containing aralkyl or alkaryl groups). When more than one organic material is used, they can be mixed prior to vaporization and provided from one source or they can be provided separately from separate sources.

Using the methods described herein, certain physical and chemical properties of the starting materials are generally maintained. That is, properties of the starting materials, such as coefficient of friction, surface energy, and transparency do not change significantly upon preparing coatings using the methods described herein, as opposed to conventional plasma processes. Thus, the methods of the present invention are very different from conventional plasma processes because the molecules are not significantly broken down to low molecular weight, reactive, species with the methods of the present invention. For example, it is believed that the —Si—O—Si—O— chain of a silicone oil remains substantially in tact in the jet plasma process of the present invention.

The methods of the present invention include providing a plasma (e.g., an argon plasma or a carbon-rich plasma as described in U.S. Pat. No. 5,464,667 (Kohler et al.)) and at least one vaporized organic material comprising at least one component from separate sources and allowing them to interact during formation of a coating. The plasma is one that is capable of activating the vaporized organic material. It can be generated using well-known means or the point source described herein. That is, the plasma can cause the vaporized organic material to become reactive, for example, as a result of radical formation, ionization, etc., although such reactive species are still capable of condensing in a vacuum to form a polymerized coating. Alternatively, the plasma can interact with the vaporized organic material as the vaporized organic material condenses on the surface in a manner such that the entire thickness of the coating is polymerized. Therefore, the plasma and vaporized organic material can interact either on the surface of the substrate or prior to contacting the surface of the substrate. Either way, the interaction of the vaporized organic material and the plasma provides a reactive form of the organic material (e.g., loss of methyl group from silicone) to enable densification of the material upon formation of the coating, as a result of polymerization and/or crosslinking, for example. Thus, the method of the present invention provides the means of high rate deposition, approaching the condensation rate of the vaporized organic material; it also provides the means of preparing coatings where the physical and chemical composition and structure of the precursor is maintained to a high degree.

The methods of the present invention preferably include the use of a radio frequency bias voltage sufficient to provide a coating having a density that is at least about 10% greater (and preferably at least about 50% greater) than the density of the major component of the organic material prior to vaporization. Preferably, the bias voltage is no more positive than about minus 50 volts, which also creates a plasma at the substrate. More preferably, the bias voltage is no more positive than about minus 100 volts, and most preferably, no more positive than about minus 200 volts. Typically, the bias voltage can be as negative as about minus 2500 volts. The specific bias voltage typically depends on the material of which the substrate is made. This high bias power can be obtained in conjunction with the use of the hollow cathode described herein. As mentioned above, the higher the bias power the higher the density of the coating. With no bias, the density of a coating made by the method of the present invention is very similar to that of conventional coatings (e.g., a silicone polymer coating with no crosslinkage) made by conventional processes (e.g., conventional PECVD methods).

In general, high density coatings (e.g., diamond-like carbon, jet plasma carbon) are prepared by plasma enhanced chemical vapor deposition (PECVD), which utilize negatively biased substrates in contact with radio frequency powered cathodes. Typically, the system provides ion bombardment of the fragmented species of feed gas (e.g., acetylene) and ions of carrier gas (e.g., argon) onto the substrate to cause atomic arrangement/rearrangement of the coating being formed to a dense structure. Simultaneously, the cathode is utilized for extensive fragmentation of the feed gas, as described in U.S. Pat. No. 4,382,100 (Holland). Because the two process parameters, namely the extensive fragmentation and the ion attraction cannot be controlled independently, conventional PECVD methods are limited and unfavorable for high rate deposition. This limitation has been overcome in U.S. Pat. No. 5,464,667 (Kohler et al.), which teaches the independent use of the hollow cathode for feed gas fragmentation and a second cathode to bias the film substrate to deposit these fragments.

The present invention includes modifications of the systems described in U.S. Pat. No. 5,286,534 (Kohler et al.) and U.S. Pat. No. 5,464,667 (Kohler et al.), which allow for the deposition of dense coatings without extensive fragmentation of the starting material. Significantly, using the process and system of the present invention, high molecular weight organic starting, materials can be converted into dense coatings without extensive fragmentation and without a significant loss of physical and chemical properties inherent to the starting material. These differences between the coatings of the present invention and coatings produced by conventional methods are exemplified by Examples 1, 3, and 4 and Comparative Example A discussed in greater detail below.

The plasma is generated from a plasma gas using a hollow cathode system, such as a "hollow cathode tube" (as disclosed in U.S. Pat. No. 5,286,534 (Kohler et al.)) or a "hollow cathode slot" (as disclosed in U.S. Pat. No. 5,464,667 (Kohler et al.)), preferably a slot comprising two electrode plates arranged parallel to each other, and more preferably, a tube in line with a slot, and then directed toward and typically past an anode (as described in U.S. Pat. No. 5,464,667 (Kohler et al.)). In one preferred embodiment, the hollow cathode slot system includes a first component having therein a hollow cathode tube, a second compartment connected to the first compartment, and a third compartment connected to the second compartment having, therein the two parallel plates. Alternatively, a system referred to herein as a "point source" can also be used as the hollow cathode system to generate a plasma. These all form a jet plasma within the hollow cathode, which is propelled past or toward an anode. This is in contrast to conventional "plasma jet" systems in which the plasma is generated between the cathode and anode and a jet stream is directed out of the cathode/anode arrangement.

The plasma gas includes a carrier gas, such as argon, and optionally a feed gas. The feed gas can be any suitable source for the desired composition of the coating. Typically, the feed gas is a source for a carbon-rich coating. The feed gas is preferably selected from the group consisting of saturated and unsaturated hydrocarbons, nitrogen-containing hydrocarbons, oxygen-containing hydrocarbons, halogen-containing hydrocarbons, and silicon-containing hydrocarbons. The vaporized organic material (preferably a vaporized organic liquid) is typically used to provide other materials that form uniform multi-component or multilayer coatings, although the plasma gas could also be the source of such components. That is, a low molecular weight silicon-containing compound could be used to generate a plasma.

Referring to FIG. 1, a particularly preferred jet plasma apparatus for deposition of such coatings is shown. This apparatus is similar to that shown in U.S. Pat. No. 5,464,667 (Kohler et al.) modified for the deposition of two materials either simultaneously or sequentially. The apparatus includes feed gas source 20 and carrier gas source 22 connected via flow controllers 24 and; 25, respectively, to inlet tubes 26 and 27, respectively. Carrier gas, e.g., argon, from the gas source 22 is fed into a vacuum chamber 30 and into a hollow cathode system 40 through an inlet port 28. Feed gas, e.g., acetylene, from the gas source 20 is fed into the vacuum chamber 30 and into the hollow cathode system 40 through an inlet port 29. The hollow cathode system 40 shown in FIG. 1 is divided into three compartments, i.e., a first compartment 41, a second compartment 42, and a third compartment 43. The carrier gas, if used, is fed into the first compartment 41, whereas the feed gas is fed into the second compartment 42. A plasma can be formed from the carrier gas in the first compartment and/or from the carrier and feed gases in the third compartment. This hollow cathode system is further discussed in U.S. Pat. No. 5,464,667 (Kohler et al.), the discussion of which is incorporated herein by reference.

In addition to the hollow cathode system 40, inside the vacuum chamber 30 is an anode system 60, which may be either grounded or ungrounded, and which preferably contains an adjustable shield 61. Also included are a radio frequency bias electrode 70, a substrate (e.g., polyethylene terephthalate "PET" film) 75, and an oil delivery system 120. The oil delivery system 120 provides a vaporized organic liquid for deposition on the substrate. It includes oil reservoir 122, cooling system 123, oil delivery system 124, evaporator chamber 126, outlet port 128, adjustable divider plate 130, and substrate protecting shield 129. The divider plate 130 is used to keep the plasma and vaporized liquid separate until they are close to the substrate. The substrate protecting shield 129 is used to avoid the condensation of vaporized liquid onto the nonbiased substrate. Both the divider plate 130 and the substrate protecting shield 129 are optional.

The substrate 75 is generally unwound from a first roll 76 and is rewound upon a second roll 78, although it can be a continuous loop of material. The plasma gas, i.e., feed gas alone or mixture of feed gas and carrier gas, is converted into a plasma within the hollow cathode system 40. The plasma 160 is then directed toward the substrate 75, which preferably contacts the radio frequency bias electrode 70 during deposition of the coating from the plasma. The substrate can be made of a wide variety of materials. For example, it can be a polymeric, metallic, or ceramic substrate. In a preferred embodiment, the substrate is a thin, i.e., less than 0.05 cm, and flexible polymeric film. Examples of useful films are oriented polyester, nylon, biaxially oriented polypropylene, and the like.

The radio frequency bias electrode 70 is made of metal, such as copper, steel, stainless steel, etc., and is preferably in the form of a roll, although this is not necessarily a requirement. For example, it can be in the form of a plate. The roll is advantageous, however, because it reduces friction between the electrode and the substrate, thereby reducing film distortion. More preferably, the radio frequency bias electrode 70 is water-cooled to a temperature no greater than about room temperature (i.e., about 25° C. to about 30° C.), preferably to a temperature of about 0° C. to about 5° C., which is advantageous when heat-sensitive substrates are used. The radio frequency bias electrode typically has a frequency of about 25 KHz to about 400 KHz, although it is possible to increase the frequency range up to and including the megahertz range. It typically has a bias voltage of about minus 100 volts to about minus 1500 volts. With the bias voltage applied, an additional plasma is created in the proximity of the radio frequency bias electrode 70 that generates a negative potential at the substrate, and attracts the plasma species 160 toward the substrate 75 for efficient and rapid deposition.

To create a plasma, a first DC power supply 80 is electrically connected directly to the first compartment 41 of the hollow cathode system 40 by a circuit 82 and to the anode system 60 by a circuit 84. The first DC power supply 80 can be a pulsating DC power supply, a filtered DC power supply, or other plasma-generating means with appropriate arc suppression, such as those used in sputtering systems. An unfiltered pulsating DC power supply is generally preferred, however. Also, a second DC power supply 85 is electrically connected directly to the third compartment 43 of the hollow cathode system 40 by a circuit 87 and to the anode system 60 also by circuit 84. In this arrangement chamber 41 and chamber 43 are electrically isolated from each other. The second DC power supply 85 can be a pulsating DC power supply, a filtered DC power supply, or other plasma-generating means with appropriate arc suppression, although a pulsating DC power supply is preferred. An example of a filtered DC power supply is a 25 kilowatt filtered DC power supply, such as that available from Hippotronics Inc., New York, N.Y. Such a power supply generates a plasma at high currents up to about 10 amperes, and relatively low voltage, i.e, about minus 100 volts.

A radio frequency biasing power supply 90 (e.g., PLASMALOC 3 power supply from ENI Power Systems, Inc., Rochester, N.Y.) is connected to the radio frequency bias electrode 70 by a circuit 92 and to a ground 100 by a circuit 94. The DC power supplies 80 and 85 can also be connected to the ground 100, although this is not a preferred arrangement. This electrical connection is represented in FIG. 1 by the dashed line 105. Thus, in this arrangement wherein all three power supplies are attached to ground 100, the anode system 60 is grounded. The former arrangement, wherein the anode system 60 is not grounded, is advantageous when compared to the latter arrangement. For example, when the anode system 60 is not grounded, the plasma formed is more stable, because the plasma sees the anode system as distinct from the grounded metal chamber. Typically, when the anode system 60 is not grounded, the cross-web coating thickness, i.e., the coating, thickness alone the width of the substrate, is more uniform. Furthermore, the plasma is more confined and the pattern of deposition can be more readily controlled by varying the exposure of the plasma to the anode system 60.

As stated above, DC power supplies 80 and 85 are preferably pulsating DC power supplies. This is because pulsating DC power supplies provide more stable plasma conditions than nonpulsating DC power supplies, which contributes to uniform plasma deposition rates and therefore down-web, i.e., alone the length of the substrate, coating uniformity. Furthermore, they allow for the use of high current flow, and thus high deposition rates, at relatively low voltage.

Whether used as the first DC power supply 80 or the second DC power supply 85, or both, a preferred pulsating DC power supply is one that provides a voltage that typically passes through zero about 25 times/second to about 1000 times/second, more preferably about 25 times/second to about 200 times/second, and most preferably about 100 times/second to about 120 times/second. This allows the plasma to extinguish and then reignite as the cathode reaches its necessary potential. Examples of such pulsating DC power supplies include the Airco Temescal Model CL-2A power supply with a 500 mA maximum output and a 120 Hz full-wave rectified DC voltage from 0 volts to minus 5000 volts. available from Airco Temescal, Berkeley, Calif. Another version of this power supply uses two Airco Temescal transformers in parallel, thereby resulting in a 1 ampere maximum output. These pulsating DC power supplies were used in the examples described below. Another power supply was built with a 20 ampere maximum output, and also used in the examples described below. This was accomplished with a larger size (1 kilowatt), leakage-type transformer obtained from MAG-CON Inc., Roseville, Minn., including full wave rectification to achieve pulsating DC output. As used herein, a "leakage-type" transformer is one that provides a stable operating point for a load with a negative dynamic resistance. Typical output of this 20 ampere power supply is 0 volts direct current (VDC) to minus 1500 VDC with current of 0 ampere to 20 amperes. This power supply is current limited, which prevents formation of high intensity arcs at the cathode surfaces. If greater currents are required, a larger leakage-type transformer can be used, or two or more smaller transformers can be arranged in parallel.

In particularly preferred embodiments of the present invention, both power supply 80 and power supply 85 are pulsating DC power supplies. In such embodiments, a carrier gas is injected into the first compartment 41 of the hollow cathode system 40 and a pulsating DC power supply, preferably a 500 mA pulsating DC power supply, is used to create a plasma from the carrier gas. Although formation of this initial carrier gas plasma may not always be necessary when a pulsating DC power supply is used to generate a plasma in the third compartment 43 of the hollow cathode system 40, it is necessary for ignition of a plasma in the third compartment when a nonpulsating filtered DC power supply is used. After initial ignition of the carrier gas plasma in particularly preferred embodiments of the present invention, this initial plasma passes into the second compartment 42 of the hollow cathode system 40 where it is mixed with the feed gas. This mixture then passes into the third compartment 43 where a second plasma is created using a pulsating DC power supply. This pulsating DC power supply can be a 1 ampere or 20 ampere power supply, as used in the examples, or it can be a 500 mA power supply or a 20 ampere, 30 ampere, 50 ampere, 100 ampere, etc., power supply, depending on the desired feed gas fragment concentration and coating deposition rate.

In the first compartment 41 of the hollow cathode system 40, such as a hollow cathode slot system, the voltage created and maintained is preferably about minus 200 volts to about minus 1000 volts, preferably about minus 200 volts to about minus 500 volts. The power supplied to this first compartment is typically about 20 watts to about 10,000 watts, preferably about 20 watts to about 1000 watts, and more preferably about 100 watts to about 500 watts. In the third compartment 43 of the hollow cathode system 40, the voltage created and maintained is preferably about minus 50 volts to about minus 500 volts, and more preferably about minus 80 volts to about minus 120 volts. The power supplied to this second compartment is typically about 50 watts to about 3000 watts, and more preferably about 1000 watts to about 3000 watts.

Given the correct conditions, a stable jet plasma 160 is formed in the vacuum chamber which spreads out in an extended pattern generally imaging the shape of the exit slot of the hollow cathode system 40. Preferred plasmas have a high feed gas fragment concentration, i.e., fragmentation of the feed gas occurs at a high rate, so as to provide a rapid deposition rate of the carbon-rich coating on the substrate 75. That is, the higher the deposition rate of a coating and the more uniform the coating, the more desirable the plasma formed, which depends on the system arrangement and the current and voltage provided. Furthermore, if a highly uniform coating can be deposited at a relatively high rate with low power requirements, the more desirable the system with respect to practical considerations (e.g., cost, safety, and preventing overheating).

To monitor the conditions in the vacuum chamber, a variety of instruments, such as a mass spectrometer, an emission spectrometer, and a capacitance manometer, can be connected to the vacuum chamber. A vacuum can be created and maintained within the vacuum chamber by any means typically used to create a vacuum (e.g., diffusion pump and/or mechanical pump). The vacuum chamber is typically maintained at a pressure of about 0.13 Pascals (Pa) to about 130 Pa, preferably at about 0.13 Pa to about 1.0 Pa. It will be understood by one skilled in the art that the method and apparatus described herein can be used in a naturally occurring vacuum, such as occurs in space.

In order to deliver liquids in vapor form into vacuum chamber 30, oil delivery system 120 is used to control oil feed rate for evaporation. As shown in FIG. 1, oil 121 is delivered from a reservoir 122 placed in vacuum chamber 30, through oil delivery orifice 124. This delivers the oil into evaporator 126 for evaporation and out evaporator outlet port 128 for delivery to the radio frequency bias electrode 70. Valve system 140 is used to expose oil 121 to the vacuum so as to become de-aerated. During this de-aeration process, oil discharge through oil delivery orifice 124 is prevented by having equal pressure above the liquid (e.g., oil 121) and at the oil delivery orifice 124. The configuration of valve system 140 is changed to introduce air into reservoir 122 in the space above oil 121 to impose a desirable pressure above the oil. Typically, the oil delivery orifice 124 is a tube or needle, such as a syringe needle, although other delivery orifices of other shapes could be used. The oil feed rate is controlled by proper selection of the temperature of the delivery means, which controls the viscosity, and the size of the delivery means, which controls the mass flow rate. Depending on the desired result, oil feed rate can be varied over a broad range. The temperature of the oil delivery orifice 124 can be regulated by cooling system 123. This can be a liquid-, gas-, or electric-cooled system. The temperature of the oil delivery orifice 124 and the evaporator 126 can be monitored using a thermocouple, for example.

FIG. 1 also shows divider plate 130 and substrate protection shield 129. Typically, these components are made of quartz, although any material can be used, such as metal, plastic, or ceramic, as long as it can withstand the temperatures experienced in the system during deposition. As stated above, these components are optional.

Figure 2:
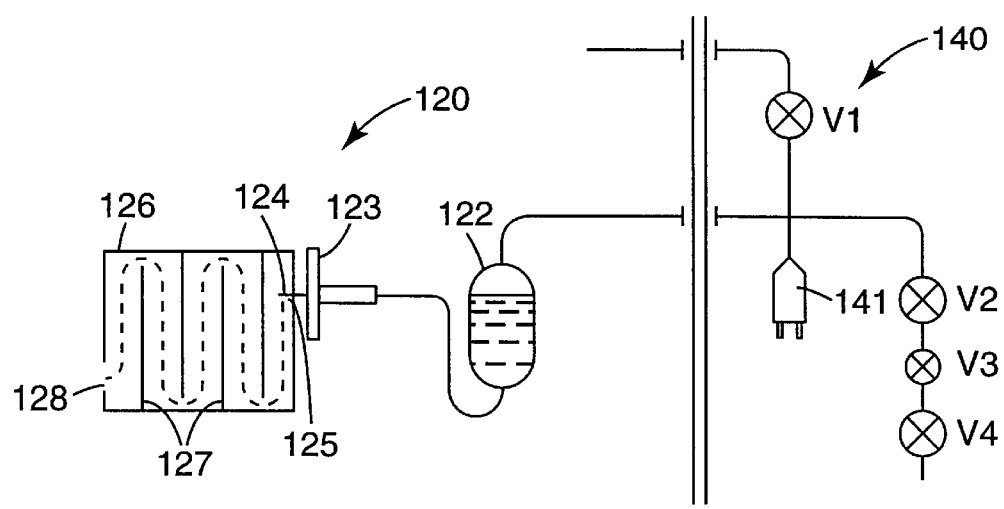
FIG. 2 is an expanded perspective view of one preferred oil delivery system of the present invention.

Oil delivery system 120 is shown in greater detail in FIG. 2, along with valve system 140. The oil delivery system 120 includes an oil reservoir 122 and a flash evaporator 126 consisting of one or more spacers 127 made of a thermally conductive material (e.g., aluminum). The spacers 127 can be heated by any of a variety of means, such as variac-controlled cartridge type resistance heaters (not shown in FIG. 2). A cooling system 123, such as a water-cooled copper sleeve, that accommodates the oil delivery orifice 124 (e.g., a needle) is placed into an inlet port 125 of the flash evaporator 126. The inlet port 125 is preferably situated at the back region of the flash evaporator 126 and preferably includes a sleeve insert, such as a silicone rubber sleeve insert, to prevent heat exchange between the flash evaporator 126 and the cooling system 123. The tip of the oil delivery orifice 124 (e.g., needle), however, is in immediate contact with the heated inlet port 125 allowing constant and uniform vaporization of the oil. The individually shaped spacers 127 preferably provide multiple spacings so that the vaporized oil is guided over the full width of the flash evaporator 126 several times upwards and downwards (as shown by the dotted line) before the vapor is discharged uniformly through an outlet port 128 into the vacuum chamber (not shown in FIG. 2).

Figure 3:
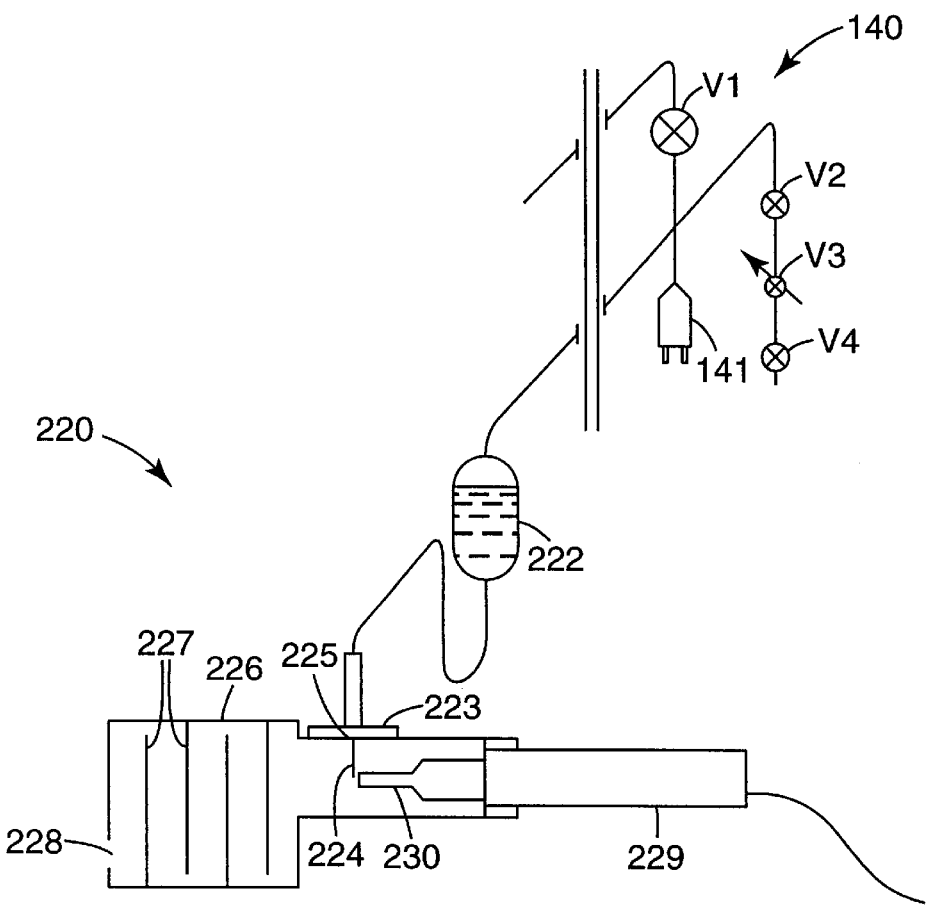
FIG. 3 is an expanded perspective view of another preferred oil delivery system of the present invention.

An atomizer can also be used to atomize the organic material (i.e., form liquid droplets of the material) prior to vaporizing the organic material. The atomizer is particularly necessary for organic materials that are unsaturated, although it can also be used with saturated organic materials. This is particularly true if extended periods of vaporization are used (e.g., greater than a few minutes) because this can clog the orifice of the evaporator. A system that includes an atomizer is shown in FIG. 3, wherein oil delivery system 220 is shown in greater detail along with valve system 140. In this embodiment, the oil delivery system 220 includes an oil reservoir 222, a flash evaporator 226 consisting of one or more spacers 227, a cooling system 223, oil delivery orifice 224, inlet port 225 in the flash evaporator 226, and an outlet port 228 as described with respect to FIG. 2. Also included to atomize the organic material is an ultrasonic horn 230 attached to an ultrasonic converter 229, as is known in the art. A useful ultrasonic system is a Branson VC54 unit (40 kHz, available from Sonics and Materials, Inc., Danbury, Conn.), tuned to provide maximum atomization. Other means by which the organic material can be atomized are described, for example, in U.S. Pat. No. 4,954,371.

Figure 4:
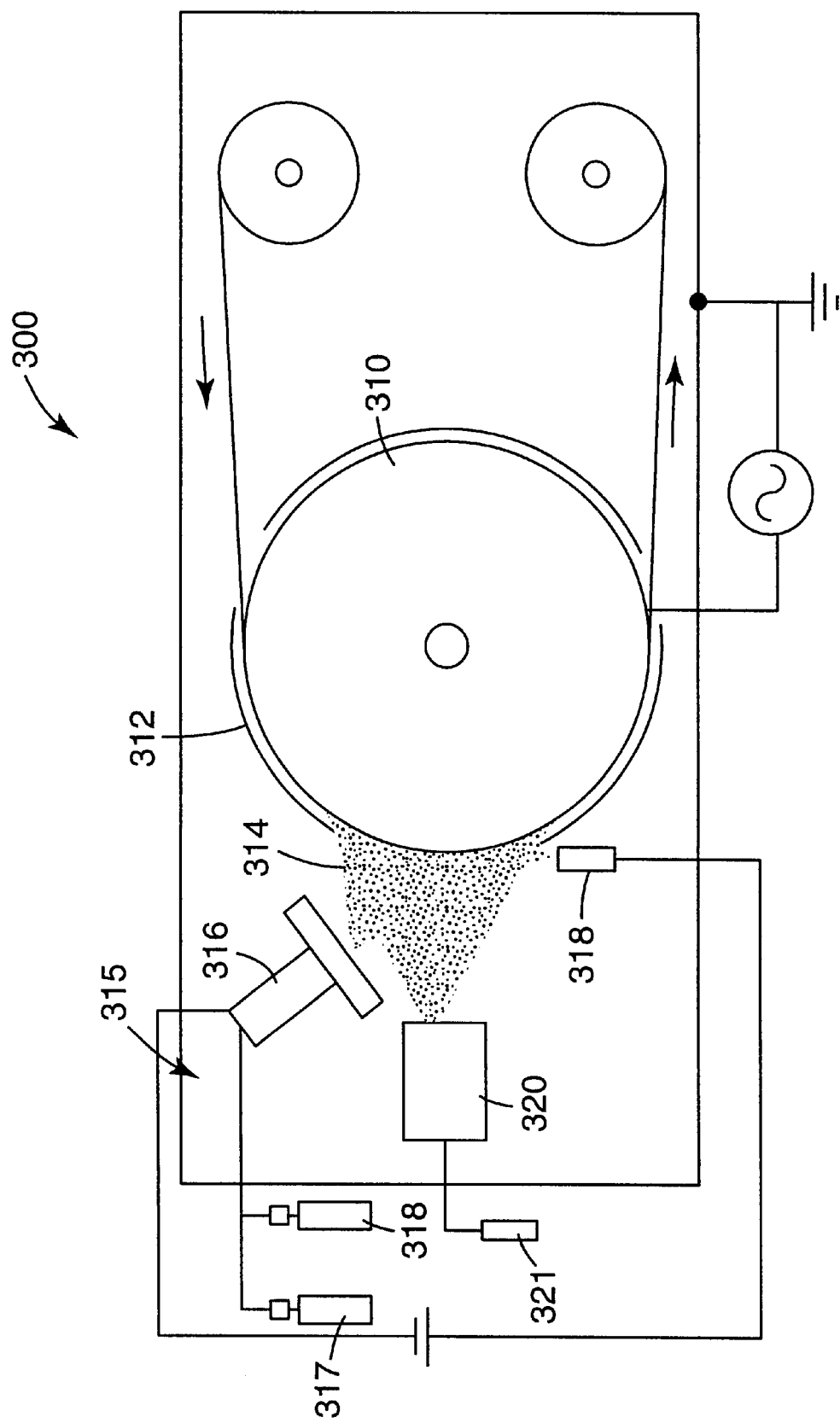
FIG. 4 is a schematic diagram of an alternative jet plasma vapor deposition apparatus of the present invention.

An alternative jet plasma vapor deposition apparatus 300 is shown in FIG. 4. This system includes a radio frequency bias electrode 310 (also referred to herein as a biased chill roll or simply a chill roll) with a portion of the radio frequency bias electrode 310 preferably covered by a dark space ground shield 312, such as an aluminum sheet, to form a discrete deposition area 314. Preferably, at least about 76% of the surface of the radio frequency bias electrode 310 is covered by dark space ground shield 312. Dark space ground shield 312 is grounded and placed about 0.3 centimeter (cm) to about 2.5 cm away from the surface of radio frequency bias electrode 310 to provide a dark space and thus concentrate the bias wattage over the exposed surface area of radio frequency bias electrode 310.

The jet plasma vapor deposition apparatus 300 of FIG. 4 also includes a hollow cathode system 315, which includes a point source cathode 316, a feed gas source 317 and a carrier gas source 318, for generating a plasma, an oil delivery system 320, attached to a valve system 321, and an anode system 322 (e.g., an anode wire as described herein). In this arrangement, the oil delivery system 320 and attached valve system 321 are optional. In the specific embodiment shown in FIG. 4, an imaginary horizontal plane can be drawn from the center of the radio frequency bias electrode 310 to the slot opening of the optional oil delivery system 320, dividing the noncovered surface area (i.e., the deposition area 314) in half. The point source cathode 316 is placed above the imaginary plane and the anode system 322 is placed below the imaginary plane. Plasma extends as a point source from the point source cathode 316 into the vacuum in a cone shape configuration concentrating near the radio frequency bias electrode 310 and at the anode wire 322. Although FIG. 4 is not too scale, in one embodiment of this system, the point source cathode 316 is placed about 7.5 cm above the imaginary plane and about 7.5 cm away from the surface of the radio frequency bias electrode 310. It is tilted from its horizontal position by about 60° to ensure a downward expansion of the plasma toward the anode wire 322 and the deposition area. The anode wire 322 is placed about 17.5 cm below the imaginary plane and about 5 cm away from the radio frequency bias electrode 310. The dark space ground shield 312 prevents the anode wire 322 from being in-line-of-sight with the deposition area. These distances, lengths, angles, and other dimensions are presented as exemplary only. They are not intended to be limiting.

Figure 5:
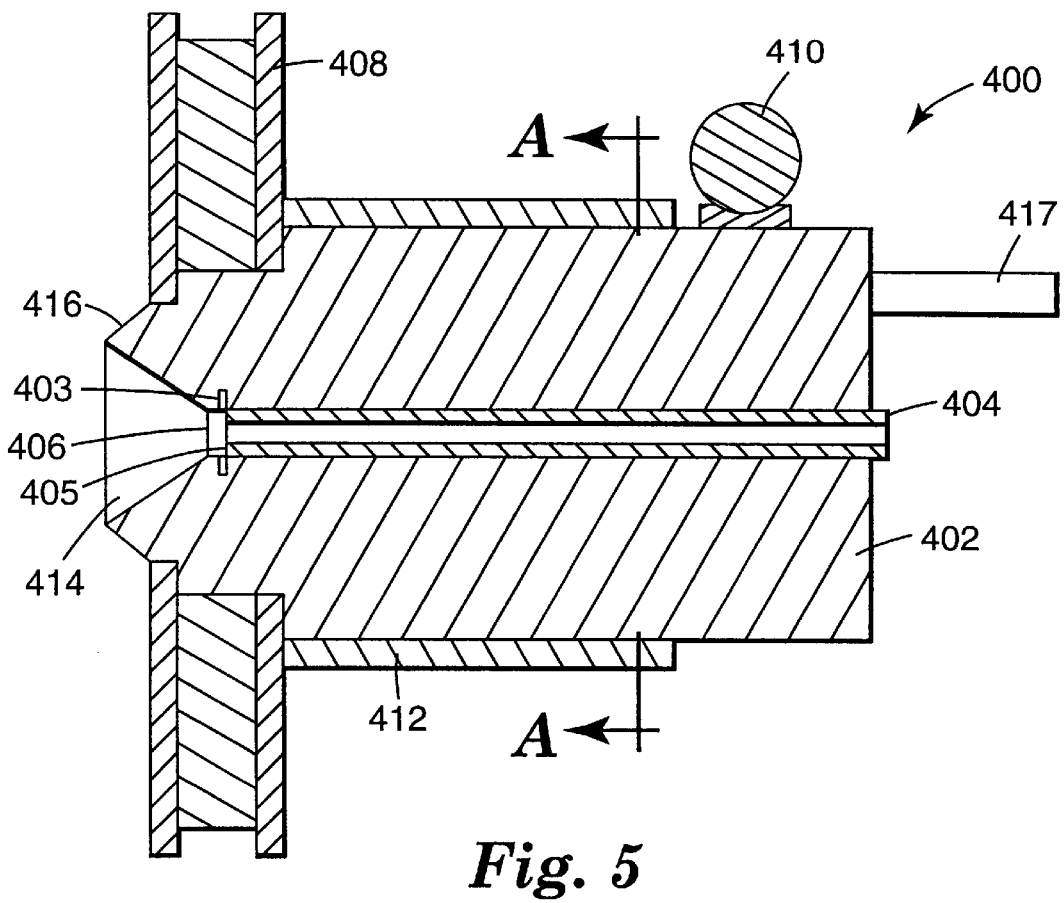
FIGS. 5 and 5a is a cross-sectional side view of a preferred hollow cathode point source of the present invention.
Figure 5A:
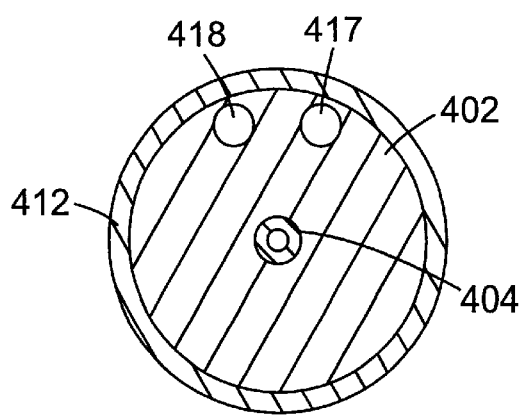

Referring to FIG. 5, a point source cathode 400 is shown, which enables the generation of a plasma from a small orifice 403 of a hollowed cylinder 402, which is surrounded by a magnet 408, preferably a circular magnet, and equipped with an electrode, such as the spherical-H.V. electrode 410. The cathode 400 preferably includes a water-cooled cylinder 402, which is typically made of copper, although it can be made of graphite or other electrically and thermally conductive metals. A tube 404, preferably having a circular cross section, is inserted inside a bore 406 of the cylinder 402 having the leading edge 405 recessed within the bore 406 of the cylinder 402 such that it is in the plane of the center line of a circular magnet 408 that surrounds the cylinder 402 at its outlet end. The tube 404 is preferably ceramic, although it can be made of other materials that withstand high temperatures and are electrical insulators. The external surfaces of the cylinder 402 can be shielded with quartz 412 (as by the use of a quartz sleeve) to avoid plasma arcing. This arrangement can be better seen in FIG. 5A. Which is a cross section of the point source cathode 400 taken along line A—A, which also shows a water inlet 417 and water outlet 418.

Using this particular configuration, a stable plasma can be sustained and contained in region 414 defined by extensions 416 of the cylinder 402. This configuration of the cylinder 402 along with the placement of the magnet 408 concentrates the plasma such that it extends as a point source into the vacuum in a cone shape configuration. It is important to note that the strongest plasma is generated if the leading edge 405 of the ceramic tube 404 is directly in line with the center (with respect to its width) of the circular magnet 408. Also, the magnetic field flux density is preferably at least about 0.15 Kgauss, and more preferably, at least about 1.5 Kgauss. The magnet 408 is preferably made of a ceramic material, although metallic alloys can be used. Ceramic materials generally have better temperature stability and a higher Curie point (i.e., the point at which magnetism is lost), and are therefore preferred.

Particularly preferred embodiments of the present invention include an anode system (60 in FIG. 1 or 322 in FIG. 4), preferably an adjustable anode system as shown in FIG. 4 of U.S. Pat. No. 5,464,667 (Kohler et al.). The anode system, particularly the adjustable anode system, contributes to the maintenance of a stable plasma, and to the uniformity of the coatings. In a preferred embodiment of the anode system used herein, however, the enclosing glass box described in U.S. Pat. No. 5,464,667 (Kohler et al.) is omitted. Typically and preferably, two tungsten wires function as the anodes. Each wire is of a sufficient diameter to provide the temperature desired, and of a sufficient length to provide the coating width desired. Typically, for a temperature of about 800° C. to about 1100° C., two tungsten wires of about 0.1 cm to about 0.3 cm in diameter function effectively as anodes with 10 amperes to 20 amperes of electron current sustained from the plasma. Portions of the wires can be covered as described in U.S. Pat. No. 5,464,667 (Kohler et al.). Again, the wire diameter and length are presented as exemplary only. They are not intended to be limiting. Any anode can be used as long as the plasma is generated in the cathode and directed toward and past the anode.

It is to be understood that one or more additional evaporators/hollow cathode tubes, slots, or point systems that generate plasmas as described herein may also be included within the systems of the present invention. The multiple systems can provide more than one layer onto the substrate or can provide an increased rate of deposition.

The processes and systems of the present invention can be used to prepare any of a variety of carbon-containing and/or silicon-containing coatings, such as amorphous highly dense coatings, layered coatings, and uniform multi-component coatings, and the like.

The composition of the coatings can be controlled by means of the concentration and composition of the feed gas passed through the hollow cathode, and the organic material vaporized in the evaporator. The density of the coatings are controlled by means of the chamber pressure, the electrical power (current and voltage) supplied by the DC and radio frequency power supplies. The conditions for the formation of high density coatings are generally chosen to balance the bias power to the concentration of the starting material. That is, the specific power density includes bias power density, reaction time, and concentration of starting material. Generally, the specific power density is increased by higher power density and longer reaction time, and decreased by increased concentration of the starting material. Generally, the higher the power density, the more dense the coating.

The bias power density typically varies from about 0.1 watt/cm$^2$ to about 10 watts/cm$^2$ (preferably, about 0.5 watt/cm$^2$ to about 5 watts/cm$^2$). The bias voltage typically varies from about minus 50 volts to about minus 2000 volts (preferably, about minus 100 volts to about minus 1000 volts). The bias current density typically varies from about 0.1 mAmp/cm$^2$ to about 50 mAmps/cm$^2$ (preferably, about 1 mAmp/cm$^2$ to about 5 mAmps/cm$^2$). The jet plasma voltage typically varies from about minus 50 volts to about minus 150 volts (preferably, about minus 80 volts to about minus 100 volts). The jet plasma current typically is at least about 0.1 Amp (preferably, at least about 0.5 Amp). The upper limit of the jet plasma current is typically dictated by the limitation of the power supply.

The chamber pressure is typically less than about 1 Torr (130 Pa). Preferably, the pressure in the reaction chamber is less than about 8 milliTorr (1.0 Pa). Generally, the less the pressure (i.e., the higher the vacuum), the more dense the coating. The web speed of the substrate (i.e., the coating rate) typically varies from about 1 foot/minute to about 1000 feet/minute (0.3 meter/minute to about 300 meters/minute). Preferably, the web speed is about 0.9 meter/minute to about 6 meters/minute. The reaction time typically varies from about 0.01 second to about 10 seconds, and preferably, from about 0.1 second to about 1 second.

As discussed below and shown in FIG. 6, the application of high bias power is a factor for obtaining excellent barrier properties. In order to achieve high bias wattage, the hollow cathode is typically positioned in line-of-sight of the film substrate/chill roll. This arrangement makes possible satisfactory interaction of the jet plasma with the biased film substrate. In the absence of the plasma, the wattage power that can be applied is significantly reduced. When the jet plasma stream is shielded from the biased film substrate, the bias power is also reduced. This indicates the necessity for a specific apparatus arrangement to maximize jet plasma flow toward the biased film substrate. Preferably, the jet plasma system provides both confinement and directionality of the plasma. Conventional systems utilizing plasma sources other than the point source of the present invention and those described in U.S. Pat. No. 5,232,791 (Kohler et al.), U.S. Pat. No. 5,286,534 (Kohler et al.), and U.S. Pat. No. 5,464,667 (Kohler et al.) lack the combination of confinement and directionality. Thus, preferred systems of the present invention are improved with respect to these parameters.

As stated previously, the plasma is created from a carrier gas or a mixture of a carrier gas and a feed gas. This is referred to herein as the "plasma gas." The carrier gas flow rate can be about 50 standard cubic centimeters per minute (sccm) to about 500 sccm, preferably about 50 sccm to about 100 sccm, and the feed gas flow rate can be about 100 sccm to about 60,000 sccm,. preferably about 300 sccm to about 2000 sccm. For example, for carbon deposition rates of about 20 Å/second to about 800 Å/second, the feed gas flow rate is about 50 sccm to about 350 sccm and the carrier gas flow rate is about 50 sccm to about 100 sccm, with higher feed gas flow rates in combination with lower carrier gas flows rates (typically resulting in higher deposition rates). Generally, for harder coatings, the carrier gas flow rate is increased and the feed gas flow rate is decreased.

The feed gas, i.e., the carbon source, can be any of a variety of saturated or unsaturated hydrocarbon gases. Such gases can also contain, for example, nitrogen, oxygen, halides, and silicon. Examples of suitable feed gases include, but are not limited to: saturated and unsaturated hydrocarbons such as methane, ethane, ethylene, acetylene, and butadiene; nitrogen-containing hydrocarbons such as methylamine and methylcyanide; oxygen-containing hydrocarbons such as methyl alcohol and acetone; halogen-containing hydrocarbons such as methyl iodide and methyl bromide; and silicon-containing hydrocarbons such as tetramethylsilane, chlorotrimethyl silane, and tetramethoxysilane. The feed gas can be gaseous at the temperature and pressure of use, or it can be an easily volatilized liquid. A particularly preferred feed gas is acetylene.

As stated previously, a carrier gas can also be used With the feed gas to advantage. For example, without the auxiliary plasma from the carrier gas the feed gas plasma is difficult to sustain at around minus 100 volts using either a pulsating or a filtered DC power supply. For example, when using only the feed gas, with a 1 ampere pulsating DC power supply the voltage rises occasionally up to about minus 1000 volts, and with a nonpulsating filtered 10 ampere power supply, the plasma is occasionally extinguished altogether.

The carrier gas can be any inert gas, i.e., a gas that is generally unreactive with the chosen feed gas under the conditions of pressure and temperature of the process of the present invention. Suitable carrier gases include, but are not limited to, helium, neon, argon, krypton, and nitrogen. Typically, higher weight gases, e.g., argon, are preferred. The terms "inert" and "carrier" are not meant to imply that such gases do not take part in the deposition process at all.

The thickness of coatings produced by the method of the present invention are typically greater than about 5 nanometers (nm), preferably about 10 nm to about 1000 nm, however, thicker coatings are possible, but not typically needed. The substrate moves through the plasma at a rate designed to provide a coating of a desired thickness. Referring to FIG. 1, the speed at which the substrate 75 travels from roll 76 to roll 78 can be about 10 mm/second to about 4000 mm/second, but is typically about 10 mm/second to about 1500 mm/second for the gas flow rates and pressures and the apparatus described above.

EXAMPLES

The present invention is further described by the following nonlimiting examples. These examples are offered to farther illustrate the various specific and preferred embodiments and techniques. It should be understood, however, that many variations and modifications can be made while remaining within the scope of the present invention.

Test Procedures

A brief description of the tests utilized in some or all of the following examples will now be given.

Water vapor permeability of the coatings was measured with a Permatran W6 Permeability Tester manufactured by Modem Controls, Inc., Minneapolis, Minn. The ASTM test method F 1249-90 included aluminum foil and PET film for standard calibration, sample conditioning overnight, cell filled halfway with deionized water and 60 minute test with a nitrogen gas pressure of 15 psi ($1.0 \times 10^5$ Pascals).

Abrasion resistance was measured by a combination of two ASTM test methods. The Taber Abrasion Test, ASTM D4060-95 was used with a "TABER" Abraser Model 503 with "CALIBRASE" CS-10F wheels (Teledyne Taber, North Tonawanda, N.Y.). A 500 g total weight load evenly distributed on the two CS-10F wheels was used. The cycles were varied between 0 and 100 cycles. The second test method was ASTM D1003 which used a Gardener Hazemeter, "HAZEGARD" System, Model XL211 (Pacific Scientific, Gardner/Neotac Instrument Division, Silver Spring, Md.). In this method the percentage of light scattering was measured before and after the specimen was Taber abraded. The lower the value, the better the abrasion resistance and hardness.

Adhesion was measured by the 90° angle peel adhesion method. The uncoated side of the film samples was affixed via double sided adhesive tape to a stainless steel panel. Usually, an aggressive, silicone based pressure sensitive adhesive tape was affixed to the coated side using a seven pound roller, rolled two times each direction over the tape. The specimens were 1.27 cm wide and about 30.5 cm long. The silicone based tape was removed from the coating at a speed of twelve inches per minute in a 90° peel using an Instron Instrument, Model 1122.

Hardness was measured by an ultramicro hardness tester UMIS 2000 from CSIRO (Australia). The indentation method included a Berkovich indenter with a 65° cone angle. The indenter was made from diamond. The hardness values were determined by the analysis of the loading-unloading data.

Density was measured by the floating method. Powdered samples were suspended in liquids of varying density and the movement of the suspended particles were observed. Upward movement indicated that the particles were less dense than the liquid; downward movement indicated that the particles were more dense than the liquid. No movement indicated identical densities. Final readings were made after twelve hours when the particles usually had risen to the top of the liquid or settled at the bottom. Using liquids with incremental differences in density, the density of the particles could be bracketed. The liquids with varying densities used are listed in Table 1.

TABLE 1

| Liquid | Density (g/cm³) |
| --- | --- |
| 1-bromoheptane | 1.14 |
| 2-bromopropane | 1.31 |
| 1-bromo-2-fluorobenzene | 1.601 |
| 4-bromoveratrole | 1.702 |

Thickness and uniformity of the jet plasma coatings on film substrates were assessed from the interference color produced by the coatings on silicone wafers. Small pieces of silicone wafers were positioned at strategic locations on the film substrate prior to deposition of the coatings. Such a method was suitable for coatings having thicknesses up to about 1500 Å. For greater coating thicknesses a step profilometer was used, manufactured by Tencor Instruments, Mountain View, Calif. The instrument measured the step formed by the coating and the adjacent uncoated area which was masked by adhesive tape during deposition.

Along with the determination of the index of refraction, thickness of the coatings was also determined from ellipsometric values obtained from the coatings on silicon wafers. The measurements were made on an ellipsometer Model 116B, manufactured by Gaertener Scientific Corporation, Chicago, Ill.

Static coefficient of friction was measured by the Inclined Plane Method. The sample, typically about 2 cm wide and 5 cm long, was fastened on a horizontal plane which could be inclined. The free ends of a U shaped steel wire (1 mm in diameter) were attached to stabilizing arms. The rounded end of the U shaped wire (paper clip like) was placed upright and in a self-supporting manner onto the sample surface. The inclined plane was raised until sliding of the U shaped steel wire began. The static coefficient of friction was equal to the tangent of the angle at which sliding began.

Example 1

Silicone coatings were deposited on 30 cm wide and 0.074 mm thick untreated polyethylene terephthalate (PET) in the system shown in FIG. 4. The system is similar to the deposition chamber described in U.S. Pat. No. 5,464,667 (Kohler et al.) with several modifications, including a point source cathode and an oil delivery system.

The system included a biased chill roll, 48.2 cm in diameter and 33.5 cm wide. Except for the deposition area, about 76% of the surface of the radio frequency bias electrode was covered by an aluminum sheet. The aluminum sheet was grounded and placed about 0.6 cm away from the surface to provide a dark space and thus concentrated the bias wattage over the remaining 24% of the surface area. An imaginary horizontal plane could be drawn from the center of the radio frequency bias electrode to the slot opening of the oil delivery system, dividing the noncovered surface area in half. The point source cathode was placed about 7.5 cm above the imaginary plane and about 7.5 cm away from the radio frequency bias electrode surface. The point source cathode was machined in the form of a hollowed cylinder and tilted from its horizontal position by about 60° to ensure a downward expansion of the plasma toward the anode wire and the deposition area. The anode wire was placed about 17.5 cm below the imaginary plane and about 5 cm away from the chill roll. The grounded aluminum sheet prevented the anode wire from being in-line-of-sight with the deposition area.

In contrast to the hollow cathode slot of U.S. Pat. No. 5,464,667 (Kohler et al.), a hollow cathode point source was used which enabled the generation of a plasma from a small orifice. As shown in FIG. 5, the cathode consisted of a water-cooled copper cylinder, 5 cm long. A ceramic tube wag inserted into the bore of the cylinder with the tip recessed to be in the plane of the center line of the magnet. The bore of the ceramic tube was 0.35 cm. The circular ceramic magnet was placed as shown in FIG. 5 at the front end of the cathode, 5.0 cm in outer diameter and 2.0 cm in inner diameter. The magnetic flux density at the center of the magnet was measured to be 0.45 Kgauss. The external surfaces of the cathode were covered with 0.3 cm thick quartz to avoid plasma arcing. A stable plasma was sustained with 150 sccm argon extending as a point source from the tip of the cathode into the vacuum and concentrating near the radio frequency bias electrode and at the anode wire.

The anode was similar to that shown in FIG. 4 of U.S. Pat. No. 5,464,667 (Kohler et al.) except the enclosing glass box was omitted. Two tungsten wires each 0.1 cm diameter and 40 cm long functioned as anodes that reached a temperature of 800–1100° C. with 10–20 amperes of electric current sustained from the plasma. The midsection of the tungsten wires were covered with quartz tubing.

In order to deliver liquids in vapor form into the vacuum chamber an oil delivery system was developed to control oil feed rate and thus oil evaporation. This is shown in FIGS. 1 and 4, and in greater detail in FIGS. 2 and 3. With the valve configuration shown in FIGS. 2 and 3, the oil was exposed to the vacuum so as to become de-aerated. This was done by first evacuating chamber 30 (FIG. 1) and then opening valves V1 and V2 and closing valve V4, with valve V3 set at the desired metering rate. The chamber was allowed to stabilize and the oil was outgassed until all residual gases were boiled off. Oil discharge through the oil delivery needle was prevented by having equal pressure above the liquid and at the needle. By changing the valve configuration, such that valve V1 was closed and valves V2, V3, and V4 were opened, air was introduced into the space above the oil. Valve V3, a flow-metering valve, was adjusted to control the pressure to impose a desirable pressure above the oil, as measured by vacuum gauge 141. Once the desirable pressure was reached, valve V2 was closed. In addition, oil feed rate was controlled by proper selection of the gauge and the temperature of the needle. The needle temperature was regulated by an attached water-temperature controlled copper sleeve.

As shown in FIG. 2 the evaporator consisted of multiple aluminum spacers that were heated by two variac-controlled cartridge type resistance heaters. The copper sleeve accommodating the oil delivery needle was placed into the inlet port of the heater. The inlet port was situated at the back region of the heater and was filled with a silicone rubber sleeve insert to prevent heat exchange between the heater and the copper sleeve. The tip of the needle, however, was in immediate contact with the heated inlet port allowing constant and uniform vaporization of the oil. The individually shaped aluminum spacers provided multiple spacings so that the vaporized oil was guided over the full width of the heater several times upwards and downwards before the vapor was discharged uniformly through a slot into the vacuum chamber as shown in FIG. 1.

The cathodic point source was powered by a 20 ampere maximum output pulsating DC power supply as described in U.S. Pat. No. 5,464,667 (Kohler et al.). The Airco Temescal CL-2A power supply consists of a leakage type power transformer that supplies AC power to a full wave bridge rectifier to yield an output, which is the absolute value of the transformer output voltage, i.e., the negative absolute value of a sine wave starting at zero volts and going to a peak negative value of about 5000 volts open circuit. Under a purely resistive load of 100 ohms, this power supply would rise to a voltage of minus 200 volts with the current limited at 500 mA. With an arc plasma as a load, the output voltage of the power supply climbs to the breakdown voltage of the apparatus and then the voltage drops immediately to the arc steady state voltage with current limited to 500 mA. Thus, the leakage transformer employed acts to limit current flow through the load or plasma in a manner similar to a resistive ballast in a typical glow discharge system. More specifically, as the cycle of power supply output voltage (starting at $T_0$) progresses through the 120 Hz waveform (starting at zero output volts), the voltage increases with time to a negative voltage value significantly above the arc steady state voltage. At this point, voltage breakdown occurs in the plasma jet, an arc is established, and the power supply output drops to the arc steady state voltage of about minus 100 volts and the saturation current of the power transformer, about 500 mA for the CL-2A power supply. As time progresses through the cycle, the power supply voltage drops below the arc voltage and the arc extinguishes. The power supply output voltage continues to drop, reaching zero volts at $T_0+\frac{1}{120}$ second and the process starts again. The time period for this entire cycle is $\frac{1}{120}$ of a second, or twice the frequency of the AC line input voltage to the power supply. The operations of the 1 amp power supply and the 20 amp power supply are identical except that the limiting currents are 1 amp and 20 amps respectively.

The positive electrode of the pouter supply was connected to the anode wires. The radio frequency bias electrode was cooled to 5° C. and connected to an RF biasing power supply (e.g., PLASMALOC 3, from ENI Power Systems, Inc., Rochester, N.Y.). The entire vacuum chamber was grounded electrically. When pumping the chamber, the pressure in the oil reservoir was the same as the chamber pressure. The oil (a dimethylsiloxane, 50 centistokes viscosity, 3780 molecular weight, available from Dow Corning under the trade designation "DC200") was de-aerated during chamber evacuation. After a de-aeration time of about 15 minutes, air was introduced into the top portion of the oil reservoir until a pressure of 325 Pa was obtained. The 22 gauge oil delivery needle was maintained at 20° C. resulted in an oil feed rate of 0.36 ml/minute. The oil evaporator was heated to about 370° C. One hundred fifty sccm of argon was introduced into the point source cathode and a stable plasma was generated and sustained at minus 100 volts and 15 amperes. The chamber pressure was between 0.13–0.26 Pa. At a web speed of about 3 meters/minute a series of experiments was conducted by varying the bias power as shown in FIG. 6.

Figure 6:
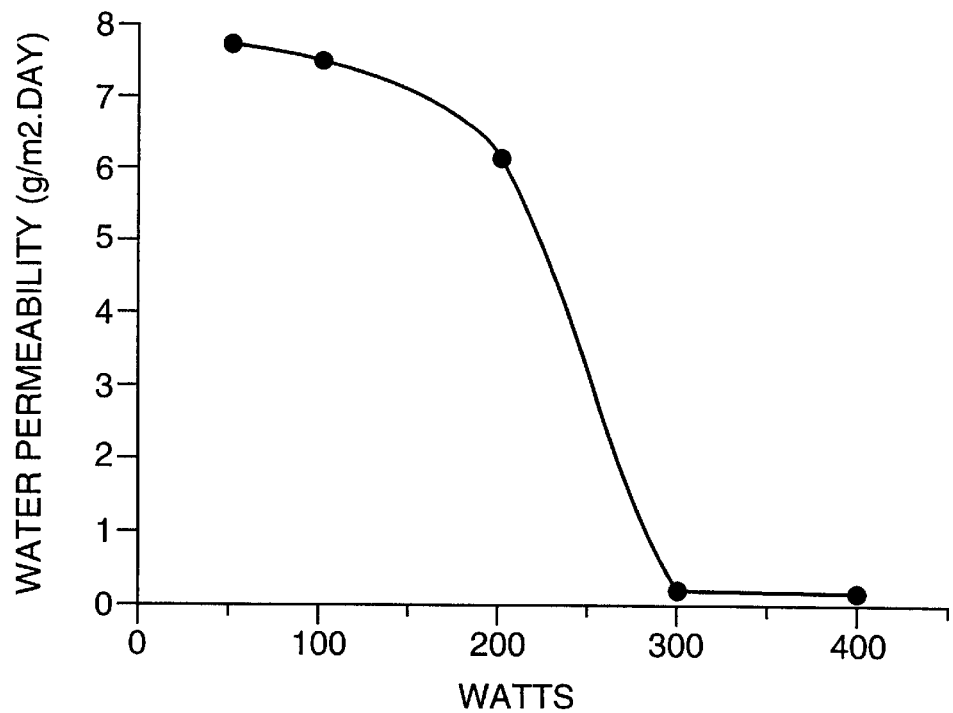
FIG. 6 is a plot of the effect of bias on moisture vapor transmission.

As shown in FIG. 6 the barrier properties of the plasma polymerized silicone coatings improved with increasing bias voltage and wattage. Contact angles of all the coatings were measured around 95° (water). The contact angle of the uncoated PET film was 75°.

An additional sample of the same oil was prepared at a bias wattage of 400 Watts and a speed of 6 meters/minute. An eleven layer coating (Sample A) was obtained by reversing the web direction five times. The coating thickness was about 3800 Å as measured by step profilometry of a simultaneously coated silicon chip placed on the PET film. Based on the eleven layer coating sample, the single layer coatings were estimated to be around 690 Å. The coating of Sample A was analyzed by Rutherford backscattering for elemental analysis. The analysis yielded in atom percent: C, 30%; Si, 30%; and O, 40%. The theoretical yield for monomethylsilicone having a formula of $-(Si(CH_3O_{1/2})O)_n-$ in atom percent is: C, 28.6%; Si, 28.6%; and O, 42.8%. This data, and the IR spectrum, the peak positions of which are listed in Table 6, below, suggest that Sample A has a composition similar to that of monomethylsilicone.

Table 2 below shows the Taber Abrasion Test results of the uncoated PET film and the one and eleven layer coatings on PET film prepared at bias wattage of 400 Watts. The lower the percent haze, the greater the abrasion resistance. Thus, abrasion resistance of the jet plasma silicone coatings increased with the increase in coating thickness.

TABLE 2

| | TABER (% HAZE) | | |
|---|---|---|---|
| CYCLES | PET | 1 LAYER (690 Angstroms) | 11 LAYERS (3800 Angstroms) |
| 0 | 0 | 0 | 0 |
| 20 | 8.5 | 5.5 | 2 |
| 40 | 12 | 8.5 | 4 |
| 60 | 15 | 10.5 | 6.5 |
| 80 | 17 | 13 | 8 |
| 100 | 18 | 14 | 12 |

The hardness of the eleven layer coating (3800 Angstroms) on a silicon wafer was 8.14 GPa. As shown below in Table 3, the hardness of the silicone coating was compared with that of an uncoated silicon chip, a glass microscope slide obtained from VWR Scientific (catalog number 48300-C25), and conventional monomethylsiloxane hard coat deposited as described in Comparative Example A.

TABLE 3

| Sample | Coating Thickness [Å] | Penetration Depth [Å] | Hardness [G Pa] |
|---|---|---|---|
| 11 Layer Coating | 3800 | 1730 | 8.14 |
| Conventional Monomethylsiloxane Hard Coat | by 5000–10,000 | 4927 | 1.33 |
| Glass Slide | | 2970 | 2.96 |
| Silicon Wafer | | 1440 | 11.96 |

This data showed that the silicone coating was significantly harder than the glass microscope slide, but softer than the silicon wafer.

The single layer silicone coatings prepared at 50 and 400 Watt bias power and the eleven layer silicone coating prepared at 400 Watt bias power were evaluated for their adhesion to the PET substrate film. Ninety degree peel strength measurements were conducted with a KRATON-based tape (Sealing Box tape #351 commercially available from 3M Company, St. Paul, Minn.). The peel strength values were around 2.6 kg/cm. Delamination occurred through cohesive failure of the adhesive. Therefore, the silicone coating/PET bonding exceeded the peel strength values measured.

Comparative Example A

The composition of conventionally prepared monomethylsiloxane was found to be similar to that of jet plasma polymerized silicone. However, when the properties of the conventional monomethylsiloxane coatings were compared with those of certain jet plasma polymerized silicone coatings, significant differences were observed.

Monomethylsiloxane (Sample E) was prepared by the following procedure: 15 ml trimethoxymethylsilane ($(CH_3O)_3CH_3Si$) were added to 85 ml water, the pH adjusted to 4 by glacial acetic acid and the mixture stirred for about 5 minutes until the solution became clear. One third of the solution was placed in an oven at 100° C. for 12 hours. A colorless residue was obtained and used for several analyses: density values were between 1.14–1.31 g/cm; the IR spectrum was nearly identical to that of jet plasma polymerized silicone. WAXS identified a broad peak at 8.7 Å. Hydrogen was determined by combustion analysis, which yielded 4.2 wt-% H. Silicon was determined by gravametric and ICP analyses., which yielded 40.4 wt-% Si. Because the theoretical values for monomethylsilicone having the formula —(Si(CH$_3$O$_{1/2}$)O)$_n$—are 4.47 w-% H and 41.9 wt-% Si, the sample appears to be monomethylsilicone.

The rest of the hydrolyzed trimethoxymethylsilane solution was adjusted to a pH of 8–9 by adding several drops of 1 N KOH solution and used for the preparation of coatings.

Coating on Silicon Wafer

Silicon wafers were immersed in 3 N KOH solution for about one minute, rinsed with distilled water and dipped in the hydrolyzed trimethoxymethylsilane solution for 10 seconds. The wafers were placed in an oven and heated for 12 hours at 100° C. The coating was not uniform in thickness and ranged according to the interference colors from about 100 Å to several microns. The hardness of the coating was around 1.33 GPA.

Coating on PET Film

The PET film (0.074 mm) was air corona treated and dipped in the hydrolyzed trimethoxymethylsilane solution for 10 seconds. The film samples were suspended in an oven and heated for 12 hours at 100° C. A continuous coating was obtained. The thickness was between 1–2 microns as measured by a film thickness gauge (Sony Magnescale Inc., Digital Indicator, U12A). The coatings did not have gas diffusion barrier properties. Water vapor permeability values of the coated and uncoated PET film were identical and around 8 g/(m$^2$.day) (measured with a Permatran W-6 Permeability tester manufactured by Modem Controls, Inc., Minneapolis, Minn.).

The following Table 4 summarizes the comparison in properties of the conventional monomethylsiloxane and the typical jet plasma polymerized silicone.

TABLE 4

| | Sample A | Sample E |
|---|---|---|
| FTIR | Jet Plasma Polymerized Dimethyl Siloxane Spectrum showed the same peaks as for dimethyl siloxane precursor except change in absorbance intensity for methyl and Si—O—Si peaks. | Conventional Monomethylsiloxane Spectrum showed the same peaks as for dimethyl siloxane precursor except change in absorbance intensity for methyl and Si—O—Si peaks. |
| Experimental Elemental Analysis | C = 30 atom % Si = 30 atom % O = 40 atom % | C = 28.6 atom % Si = 28.6 atom % O = 42.8 atom % |
| Theoretical Elemental Analysis | H = 4.47 wt-% Si = 41.9 wt-% | H = 4.2 wt-% Si = 40.4 wt-% |
| Density [g/cm$^3$] | 1.601–1.702 | 1.14–1.31 |
| Hardness [GPA] | 8.14 | 1.33 |
| Water Vapor Permeability [g/m$^2$ · day] | ~0.01 | 8 |
| WAXS | Broad Peak at 7Å | Broad Peak at 8.7Å |

Example 2

Carbon-rich coatings were deposited on 30 cm wide and 1.4×10$^{-3}$ cm thick video grade polyethylene terephthalate (PET) film having therein less than about 1% SiO$_2$ slip agent (OX-50 from Degussa of Germany), which had been corona treated and wrapped for storage and handling in a packaging film with moisture barrier characteristics (manufactured by 3M Company, St. Paul, Minn.). The experiment was similar to Example 3 of U.S. Pat. No. 5,464,667 (Kohler et al.), which is incorporated herein by reference, except that the hollow cathode slot was replaced by the hollow cathode point source (i.e., point source cathode) described above in Example 1. The development of the point source cathode simplified the cathode system and eliminated several components of the hollow cathode slot system, including the argon plasma compartment together with the argon plasma power supply and the acetylene compartment.

The point source cathode was placed about 17.5 cm away from the biased chill roll. After the vacuum system was evacuated to about 1 mTorr (0.13 Pa), 35 sccm argon and 1000 sccm acetylene were introduced together into the point source cathode. A stable plasma was generated and sustained from the orifice of the cathode and expanded in cone shape toward the deposition area. The DC pulsating power supply was set at 15 amperes and minus 75 to minus 95 volts. The radio frequency bias electrode was biased to minus 300 volts. The power consumption was 320–400 watts. The web speed was about 15 meters/minute. The pressure varied between 2.3 Pa and 3.0 Pa. The experiment was run for about 3–4 hours during which no significant changes in the barrier properties of the coating was experienced. The water vapor permeability stayed constant at around 1 g/(m$^2$ day) as compared to an uncoated sample, which has a water vapor permeability of about 30 g/(m $^2$.day). The extended time period of a stable plasma (i.e., about 3–4 hours) is a significant advantage of the point source cathode. Without the circular magnet the small orifice becomes plugged by carbon within several minutes.

Example 3

Silicone coatings were deposited on 15 cm wide and 2.54×10$^{-3}$ cm thick film available under the trade designation "KAPTON" film from DuPont de Nemours (Wilmington, Del.), Type 100H. Except for the addition of an oil delivery system (described above) all other components of the deposition system were identical to those described in Example I of U.S. Pat. No. 5,464,667 (Kohler et al.); however, the arrangement of the deposition system was modified. The hollow cathode slot system was 9 cm away from the chill roll. Drawing an imaginary horizontal plane from the center of the radio frequency bias electrode to the cathode, the cathode slot was about 1.6 cm below the plane. The anode wire was about 4 cm away from the cathode slot and about 6 cm below the imaginary plane. A Pyrex glass plate (20 cm wide, 5 cm long, 0.3 cm thick) was placed parallel to and about 0.6 cm below the imaginary plane reaching from the front of the cathode box toward the radio frequency bias electrode and leaving about 4 cm between the glass plate and the front of the chill roll. The oil evaporator was positioned on the glass plate. The evaporator slot was about 1.2 cm above the glass plate and about 4 cm away from the chill roll. Another glass plate was placed upwards at a 45° angle leaving a slot opening of about 1.5 cm between the glass plates. This arrangement allowed the oil vapor to be condensed and polymerized on the film substrate that was in contact with the biased chill roll. Subsequent condensation of oil vapor above the radio frequency bias electrode was avoided to a high degree. The hollow cathode slot was about 15 cm wide and the graphite plates had a gap of about 0.6 cm. The radio frequency bias electrode was 5 cm in diameter, 18 cm long, chilled to 5° C. The grounding box, i.e., anode, was about 20 cm wide and included a 0.1 mm diameter tungsten wire. All power supplies, including the anode, were connected to a common ground. After the vacuum chamber was evacuated to a pressure of about 0.13 Pa, 100 sccm argon was introduced into the argon plasma chamber, i.e., the first compartment of the hollow cathode slot system. The plasma was sustained about minus 450 volts and at a pulsating DC current of 0.5 amp using the Airco Temescal Model CL-2A power supply (maximum output of 0.5 amp). The hollow cathode slot was powered by the 25 kilowatt nonpulsating filtered DC power supply from Hippotronics to enhance the argon plasma ignited in the front compartment. The current was 8000 mA at about minus 100 volts. The Dow Corning DC200 silicone oil having a viscosity of 50 centistokes (cts) and a molecular weight of 3780 was vaporized according to the procedure described in Example 1. About 50 cm Kapton film, as described above, was transported in loop form over the radio frequency bias electrode and the two rolls of the web drive system. The deposition time was determined from the web speed, the number of loop turns and the contact area of the film with the chill roll. The length of the contact area was 3.3 cm. The film accommodated silicon ships and germanium crystal to measure the special properties of the deposited silicone by elipsometry and FTIR spectroscopy, respectively. Variation in deposition parameters, in particular the bias power, resulted in significant differences in coating properties, as shown in Table 5. Table 5 shows the difference in properties of a nonbiased Sample A and a biased Sample B.

TABLE 5

| SAMPLE | SAMPLE A | SAMPLE B |
| --- | --- | --- |
| BIAS WATTAGE | 0 | 25.0 |
| BIAS VOLTAGE | 0 | −1400 |
| DEPOSITION TIME | 0.96 second | 1.54 second |
| DEPOSITION RATE | 0.34 cm/second | 0.2 cm/second |
| MOISTURE PERMEABILITY | 55 g/m$^2$ · day | 2.5 g/m$^2$ · day |
| ESCA Atom percent (O/C/Si) | 29.6/48.4/22.0 | 29.9/48.8/21.2 |
| INDEX OF REFRACTION | 1.327 | 1.464 |
| THICKNESS | 3595 Å | 1252 Å |

IR spectra of Sample B and DC200 silicone oil show the structural changes as a result of biased jet plasma polymerization. The position and intensity of the absorption peaks are listed in Table 6 below.

TABLE 6

| SAMPLE | WAVE NUMBER (cm$^{-1}$) | ASSIGNMENT | ABSORBANCE INTENSITY | ABSORBANCE INTENSITY RATIO (1260/1019) |
| --- | --- | --- | --- | --- |
| SILICONE OIL | 1019 | Si—O stretch | 0.397 | 0.980 |
|  | 1091 | Si—O stretch | 0.326 |  |
|  | 1260 | CH$_3$ rocking mode | 0.389 |  |
| B | 1020 | Si—O stretch | 0.670 | 0.578 |
|  | 1261 | CH$_3$ rocking mode | 0.387 |  |
|  | 2151 | Si—H stretch | 0.011 |  |

Based on the absorbance intensity ratios, the biased jet plasma polymerization reduced the methyl concentration of the coating by about 40% and introduced some Si—H bonding. The lack of absorption peaks for C—H and C—H$_2$ moieties suggested band cleavage between the silicon atoms and the methyl groups and the subsequent polymerization of the formed silicone radicals. As indicated by the ESCA results, oxygen appeared to be involved in the polymerization, most likely resulting into Si—O—Si crosslinkage. In comparison with the atomic percent ratio of a conventional silicone polymer that has a Si:C:O ratio of 24.95:50.66:24.39, the oxygen concentration of sample B was significantly higher.

Example 4

The deposition system, jet plasma conditions, and substrate were the same as described in Example 3, except that the "KAPTON" film was wrapped around the chill roll. About 25% of the surface was exposed to the plasma while the rest was covered with a nylon cover creating a gap of about 2 mm. The nylon cover was the same as that used in Example 1 for the protection of the bare chill roll. DC200 silicone vapor was jet plasma polymerized onto the film for about 15 minutes while the radio frequency bias electrode was rotating at about 10 rpm and was biased at about 25 watts and minus 450 volts (sample A, which was prepared according to a process of the invention). In a second experiment the bias power was increased to about 250 watts and about minus 1200 volts (sample B, which was prepared according to a process of the invention). The coatings were scraped off the film and collected in powder form. A third sample was collected from a glass plate positioned close to the chill roll. This sample was considered typical of a nonbiased jet plasma polymerized silicone coating (Sample C, which was prepared according to a process of the invention). The data in Table 7 below compares the carbon and hydrogen analyses of the different coatings. Table 7 also includes the analysis of the DC200 silicone oil (Sample D, starting material), the conventional monomethylsiloxane (Sample E, which was prepared using a conventional process described in Comparative Example A), and density values of all the samples.

TABLE 7

| SAMPLE | WEIGHT % C | WEIGHT % H | H:C atom ratio | Density (g/cm$^3$) | Intensity of Peak (WAXS) Before . . . After |
| --- | --- | --- | --- | --- | --- |
| A | 16.53 | 4.96 | 3.6 | 1.601–1.702 |  |
| B | 15.40 | 4.43 | 3.4 | 1.601–1.702 | 7.2 |
| C | 30.31 | 7.84 | 3.1 | <1.140 | 7.2 |
| D | 33.47 | 8.34 | 3.0 | 0.96 (from literature) | 7.2 |
| E |  |  |  | 1.14–1.31 | 8.7 |

Minor changes in the carbon and hydrogen concentrations occurred when the DC200 silicone oil (Sample D) was jet plasma polymerized without bias (Sample C). A significant decrease in carbon and hydrogen concentration was apparent for the biased samples (Samples A and B). The C:H atom ratio was greater than three, which substantiated the FTIR spectroscopy results. namely the loss of methyl groups and the formation of Si—H bonding.

Samples A, B, C, D, and E were examined by N-ide angle x-ray scattering (WAXS) for purposes of identifying the presence of crystallinity. Data were collected using a Philips vertical diffractometer, copper K$_\alpha$ radiation, and proportional detector registrar of the scattered radiation. An interference peak on the order of 7.2 Å was produced by all materials and is the only structural feature observed. The position of the interference maximum produced by the oil did not change position upon polymerization. This indicates that the structural features present in the oil maintained their approximate arrangement after undergoing polymerization. The observed peak was sufficiently broad that the materials were not considered to possess crystallinity, but rather possessed a structural feature that repeated itself on a 7 Å length scale. Amorphous carbon and amorphous silica, often used as barrier coatings, produce peaks at considerably higher angle, normally between 20 and 30 degrees (2Q), which correspond to distances on the order of 4.5–3 Å. These data indicated that the polymerized material were distinctly different from amorphous carbon and silica materials. A different structural feature was obtained from Sample E, which showed a broad peak at 8.7 Angstroms.

Example 5

Nujol, an aliphatic hydrocarbon oil was deposited onto the substrate described in Example 3 using the system arrangement described in Example 3. Except for the oil delivery, the procedure was also the same. At a pressure of 1300 Pa in the oil reservoir the liquid was introduced into the evaporator heated at 280° C. The oil delivery needle gauge and temperature were 22° C. and 20° C., respectively. Four loop turns of the film were made within 123 seconds resulting in a deposition time of 3.5 second. The pressure during jet plasma polymerization stayed most of the time below 0.26 Pa. The water vapor permeability of the coating was around 40 g/(m$^2$.day). This value was lower than the water permeability of the uncoated film (>55 g/(m$^2$.day)) and thus indicated barrier properties of a hydrocarbon polymer. The IR spectra of this coating and the original Nujol showed minor structural changes. The corresponding absorbance intensity ratios varied between 10% and 20%.

Examples 6–8

The deposition procedure was similar to that described in Example 3 except an acetylene/argon mixture was used as the jet plasma feed gas and a divider in the form of a glass plate was installed in between the two sources of acetylene/argon feed gas and silicone vapor. The series of examples illustrated the formation of multiple layer coatings and showed changes in properties depending on the position of the divider.

Example 6

The apparatus arrangement including the hollow cathode slot system, grounding box and radio frequency bias electrode were similar to that described in Example 3. The oil delivery system consisted of a syringe pump, Teflon tubing (about 1 mm in diameter) connected to the syringe and leading into the vacuum chamber, a 25 gauge microsyringe needle connected to the Teflon tubing and inserted into the evaporator as described in Example 1. DC 200 silicone oil (50 cts, Dow Corning Inc.) was fed at about 0.05–0.5 ml/minute into the evaporator heated at about 350° C. It should be emphasized that due to imperfections in the early stages of the development of the oil delivery system the exact amount of oil available for evaporation and deposition could not be assessed from the flow rates indicated by the settings of the syringe pump. PET film (1.27×10$^{-3}$ cm thick and 15 cm wide) was used as the substrate and continuously unwound from a first roll and rewound upon a second roll at a web speed of 3 m/minute. The divider was as close as possible to the chill roll, about 0.3 cm. The argon plasma was sustained at a flow rate of 50 sccm using a DC pulsating power supply at 0.5 amp and minus 475 volts. The hollow cathode slot was powered by a 25 kW filtered DC power supply from Hippotronics. At a flow rate of 200 sccm acetylene the plasma was sustained at about 8 amps and about minus 100 volts. The radio frequency bias electrode was cooled to about 10° C. and biased at about minus 1000 volts. A coating was obtained about 1350 Å thick. The coating on PET film has a static coefficient of friction of 0.15 and water vapor permeability values of about 2.5 g/(m$^2$.day). The FTIR spectrum of a coated germanium crystal (placed on the PET film) showed mainly absorption bands characteristic for silicone oil DC 200. After rinsing with toluene the silicone coating was completely removed, a strong evidence that no polymerization of the dimethyl silicone oil had occurred.

Example 7

This example showed the importance and sensitivity of divider position for dimethyl silicone polymerization. Identical conditions were used as those described in Example 6 except for widening the gap between the divider and the film substrate to about 0.9 cm. The FTIR spectrum was identical to that of Example 6. However, after thorough rinsing with toluene about 75% of the coating was removed. This was an indication that the increased interaction of the plasma carbon with the dimethyl silicone vapor resulted in partly polymerized dimethyl silicone.

The partly polymerized silicone coatings were found to be excellent lubricant coatings. Table 6 summarizes the static coefficient of friction values obtained on 1.27×10$^{-3}$ cm coated "KAPTON" film before and after soxhlet extraction (about 16 hours in toluene). The different thicknesses were obtained by varying the web speed between about 1–18 meters/minute. The thickness was estimated from the interference color on coated silicone wafers. Table 8 shows static coefficient of friction values that indicate a high degree of lubrication for extremely thin coatings and for a coating construction which contained both a highly polymerized silicone portion (matrix) and a less polymerized or unpolymerized silicone oil.

TABLE 8

| Thickness (Å) | 300 | 250 | 150 | 75 | 40 |
| --- | --- | --- | --- | --- | --- |
| JP Polymerized Silicone Oil | 0.06 | 0.06 | 0.10 | 0.09 | 0.10 |
| JP Polymerized Silicone Oil after Soxhlet Extraction | 0.04 | 0.06 | 0.11 | 0.13 | 0.14 |

Example 8

Figure 7:
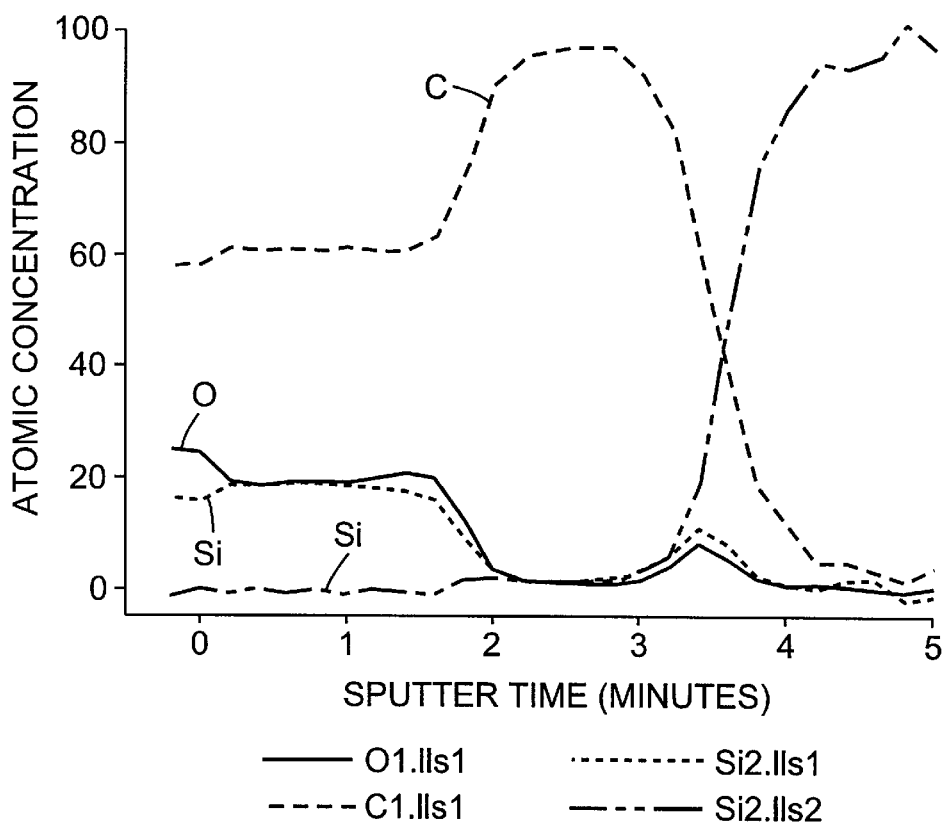
FIG. 7 is an Auger Spectroscopy depth profile of a coating of the present invention on a silicon wafer.

This example confirmed the importance of sufficient divider spacing for complete polymerization. Conditions were identical with those in Example 7 except for the greater distance between the divider and the substrate (about 1.5 cm). The FTIR spectrum was very similar to the previous one. However, in contrast to Examples 6 and 7, rinsing with toluene did not decrease appreciably the intensity of the FTIR absorption peaks. Thus, the increased distance between the divider and the substrate caused a sufficient interaction between jet plasma carbon and the dimethyl silicone vapor to warrant a fully polymerized, cross-linked dimethyl silicone structure with excellent adhesion to the substrate. The coating on PET film had a static coefficient of friction of 0.23 and water vapor permeability values of about 1.5 g/(m$^2$.day). A depth profile of the coating on silicone wafers was conducted by Auger Spectroscopy. The spectrum showed two distinct layers: a carbon layer adjacent to the substrate and a silicone layer with a small interfacial region between the carbon and the silicone layer as shown in FIG. 7.

The adhesion of the multi-layer coatings of Examples 6–8 were evaluated by 90° peel strength testing and summarized in Table 9. In all cases delamination occurred at the interface between the coating and the adhesive tape. In particular, the high peel strength values obtained with samples of Example 8 indicated that the adhesion of the fully polymerized dimethyl silicone layer to the carbon layer and also the adhesion of the carbon layer to the PET film substrate were at least 5.5 N/dm or greater. The high adhesion and the intrinsic low surface energy values of the silicone coatings suggested their use for release coatings and other low surface energy coatings.

TABLE 9

|  | Peel Strength (N/dm): |
|---|---|
| Example 6 Unpolymerized DC 200 Oil | 2.3 |
| Example 7 Partly Polymerized DC 200 Oil | 2.7 |
| Example 8 Fully Polymerized DC 200 Oil | 5.8 |
| PET Film Substrate (Control) | 5.6 |

Example 9

Polyperfluoroether (Fomblin) was another oil that was polymerized without containing conventional, polymerizable functionalities. Multi-layer coatings were obtained with excellent lubrication properties. Apparatus arrangement and process conditions were similar to those in Example 7. Experimental evaporated Co/Ni thin film on a PET substrate (3M magnetic recording film) and $2.5 \times 10^{-3}$ cm "KAPTON" film were used as substrates. The radio frequency bias electrode was biased at minus 300 volts. The FTIR spectrum of the coating showed absorption peaks typical for Fomblin; however, when the coated germanium crystal was washed in FC77, about 75% of the Fomblin was washed off. The coatings offered a unique multilayer construction in which the partial polymerized polyperfluoroether top coat functioned as a lubricant and the jet plasma carbon base as a protective and priming layer to the substrate. Table 10 shows the static coefficient of friction values in dependence of coating thicknesses before and after soxhlet extraction in FC77 (16 hours). In comparison, Sony Hi 8 ME Co/Ni tape had static coefficient of friction values between 0.26–0.32.

TABLE 10

| Thickness (Å) | 150 | 100 | 75 | 50 | 35 | 25 |
|---|---|---|---|---|---|---|
| JP Polymerized Polyperfluoroether | 0.18 | 0.20 | 0.20 | 0.22 | 0.24 | 0.28 |
| JP Polyermized Polyperfluoroether after Soxhlet Extraction | 0.21 | 0.23 | 0.24 | 0.25 | 0.26 | 0.33 |

Example 10

Homogeneous coatings were prepared by a procedure utilizing two feed sources. This method provided the means to obtain new coating properties. Apparatus arrangement and process conditions were similar to those described in Example 3. The hollow cathode slot and the evaporator slot was placed parallel and in proximity of the radio frequency bias electrode (less than 7 cm). A divider was omitted. A $2.5 \times 10^{-3}$ cm thick and 15 cm wide "KAPTON" film obtained from DuPont type 100H was used as the film substrate that was transported in loop form around the two rolls of the web drive and the radio frequenc bias electrode for multiple deposition passes. The "KAPTON" film also accommodated silicon wafers. After the main vacuum chamber had been evacuated to a pressure of about 1 mTorr, 100 sccm argon was introduced into the argon plasma chamber, i.e., the first compartment of the hollow cathode slot system. The plasma was sustained at about minus 475 volts and a pulsating DC current of about 500 mA. At a flow rate of 150 sccm, acetylene was introduced into the mixing chamber, i.e., the second compartment of the hollow cathode slot system. The hollow cathode slot was powered by a second pulsating DC power supply. The plasma current was 1 amp at about minus 100 volts. The radio frequency bias electrode was cooled to about 5– 10° C. The bias voltage was minus 1500 volts. The dimethylsilicone oil was introduced into the oil evaporator by way of a microsyringe pump with a feed of 0.05–0.5 ml/minute. A 25 gauge syringe needle was used. The run was completed after 20 passes. The coating was about 2800 Å thick and showed excellent water vapor barrier values of 0.17 g/(m².day). The contact angle and the static coefficient of friction were 99° and 0.22, respectively. The Auger depth profile showed a uniform composition throughout the coating including carbon, silicon, and oxygen.

The present invention has been described with reference to various specific and preferred embodiments and techniques. It should be understood, however, that many variations and modifications may be made while remaining within the spirit and scope of the invention. All patents, patent applications, and publications are incorporated herein by reference as if individually incorporated.

What is claimed is:

1. A method for the formation of an organic coating on a substrate comprising:

providing a substrate in a vacuum;

providing at least one vaporized organic material comprising a least one component from at least one source, wherein the vaporized organic material is capable of condensing in a vacuum of less than about 130 Pa at or below room temperature;

providing a plasma from at least one source other than the source of the vaporized organic material;

directing the vaporized organic material and the plasma toward the substrate wherein the substrate is in close proximity to a radio frequency bias electrode such that the substrate is exposed to a radio frequency bias voltage; and causing the vaporized organic material to condense and polymerize on the substrate in the presence of the plasma to form an organic coating.

2. The method of claim 1 wherein the plasma is formed from an inert gas.

3. The method of claim 2 wherein the coating formed is a single layer of organic material.

4. The method of claim 2 wherein the polymerized organic material comprises a layer of multiple organic materials.

5. The method of claim 1 where the plasma is formed from a carrier gas and a feed gas wherein the feed gas is selected from the group consisting of saturated and unsaturated hydrocarbons, nitrogen-containing hydrocarbons, oxygen-containing hydrocarbons, halogen-containing hydrocarbons, and silicon-containing hydrocarbons.

6. The method of claim 1 wherein the coating has a density that is at least about 10% greater than the density of the major component of the organic material prior to vaporization.

7. The method of claim 1 wherein the step of causing the vaporized organic material to condense and polymerize comprises:

causing the plasma to interact with the vaporized organic material
   and form a reactive organic species; and contacting the substrate with the reactive organic species to form an organic coating.

8. The method of claim 1 wherein the step of causing the vaporized organic material to condense and polymerize comprises:

condensing the vaporized organic material on the substrate in the presence of the plasma to form reactive species that polymerize to form the organic coating.

9. The method of claim 1 wherein the coating has a density that is about 50% greater than the density of the major component of the organic material prior to vaporization.

10. The method of claim 1 wherein the vaporized organic material comprises vaporized mineral oil.

11. The method of claim 10 wherein the plasma comprises a carbon-rich plasma and the vaporized organic material comprises vaporized dimethylsiloxane oil.

12. The method of claim 10 wherein the coating formed comprises a layer of a carbon-rich material, a layer of dimethylsiloxane that is at least partially polymerized, and an intermediate layer of a carbon/dimethylsiloxane composite.

13. The method of claim 1 wherein the step of providing a plasma comprises generating a plasma in a vacuum chamber by:

injecting a plasma gas into a hollow cathode system;

providing a sufficient voltage to create and maintain a plasma within the hollow cathode system; and maintaining a vacuum in the vacuum chamber sufficient for maintaining the plasma.

14. The method of claim 13 wherein the hollow cathode system is a hollow cathode slot system comprising two electrode plates arranged parallel to each other.

15. The method of claim 14 wherein the hollow cathode slot system comprises a first compartment having therein a hollow cathode tube, a second compartment connected to the first compartment, and a third compartment connected to the second compartment having therein the two parallel plates.

16. The method of claim 15 wherein the step of injecting a plasma gas comprises injecting a carrier gas into the first compartment and a feed gas into the second compartment.

17. The method of claim 16 wherein a plasma is formed from the carrier gas in the first compartment.

18. The method of claim 16 wherein a plasma is formed from the carrier gas and the feed gas in the third compartment.

19. The method of claim 18 wherein the feed gas is selected from the group consisting of saturated and unsaturated hydrocarbons, nitrogen-containing hydrocarbons, oxygen-containing hydrocarbons, halogen-containing hydrocarbons, and silicon-containing hydrocarbons.

20. The method of claim 13 wherein the hollow cathode system comprises a hollow cathode tube.

21. The method of claim 13 wherein the hollow cathode system comprises:

a cylinder having an outlet end;

a magnet surrounding the outlet end of the cylinder; and a tube having a leading edge, wherein the tube is positioned inside the cylinder and recessed such that the leading edge of the tube is in the plane of the center line of the magnet.

22. The method of claim 21 wherein the magnet is made of a ceramic material.

23. The method of claim 21 wherein the tube is made of a ceramic material.

* * * * *

UNITED STATES PATENT AND TRADEMARK OFFICE
CERTIFICATE OF CORRECTION

PATENT NO.     : 6,348,237 B1                                                Page 1 of 1
DATED          : February 19, 2002
INVENTOR(S)    : Kohler, Gunter A.

It is certified that error appears in the above-identified patent and that said Letters Patent is hereby corrected as shown below:

Column 7,
Line 17, "starting, materials" should read -- starting materials --.
Line 37, "having, therein" should read -- having therein --.

Column 9,
Line 39, "alone" should read -- along --.
Line 49, "alone" should read -- along --.

Column 12,
Line 60, "too" should read -- to --.

Column 15,
Line 36, "With" should read -- with --.

Column 23,
Line 17, "ships" should read -- chips --.

Column 24,
Line 51, "results." should read -- results, --
Line 53, "N-ide" should read -- wide --.
Line 57, "registrar" should read -- registry --.

Column 28,
Line 30, "comprising a least" should read -- comprising at least --.

Signed and Sealed this

Twenty-fifth Day of June, 2002

*Attest:*

JAMES E. ROGAN
*Attesting Officer*    *Director of the United States Patent and Trademark Office*